US008392811B2

(12) United States Patent
Lee et al.

(10) Patent No.: US 8,392,811 B2
(45) Date of Patent: Mar. 5, 2013

(54) METHODS AND SYSTEMS FOR A-PRIORI DECODING BASED ON MAP MESSAGES

(75) Inventors: Chun Woo Lee, San Ramon, CA (US); Jong Hyeon Park, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1096 days.

(21) Appl. No.: 11/970,373

(22) Filed: Jan. 7, 2008

(65) Prior Publication Data
US 2009/0177951 A1 Jul. 9, 2009

(51) Int. Cl.
H03M 13/00 (2006.01)
H03M 13/03 (2006.01)
H04L 27/06 (2006.01)

(52) U.S. Cl. ........ 714/799; 714/795; 714/794; 714/792; 714/811; 375/341

(58) Field of Classification Search .................. 714/799, 714/795, 794, 792, 821, 811; 375/341
See application file for complete search history.

(56) References Cited

U.S. PATENT DOCUMENTS

| | | | |
|---|---|---|---|
| 5,721,745 A | 2/1998 | Hladik et al. | |
| 5,721,746 A | 2/1998 | Hladik et al. | |
| 6,332,208 B1* | 12/2001 | Aizawa | 714/786 |
| 6,608,828 B1* | 8/2003 | Balachandran | 370/349 |
| 7,587,005 B2* | 9/2009 | Tran | 375/341 |
| 7,877,673 B2* | 1/2011 | Choi et al. | 714/784 |
| 8,000,411 B2* | 8/2011 | Park et al. | 375/316 |
| 2004/0022181 A1 | 2/2004 | Coffey | |
| 2004/0194005 A1* | 9/2004 | Huggett | 714/795 |
| 2006/0120488 A1* | 6/2006 | Heiman et al. | 375/341 |
| 2007/0030926 A1* | 2/2007 | Brown et al. | 375/340 |
| 2007/0124654 A1* | 5/2007 | Smolinske et al. | 714/786 |
| 2008/0034274 A1* | 2/2008 | Song et al. | 714/796 |
| 2008/0123579 A1* | 5/2008 | Kozat et al. | 370/312 |
| 2008/0240305 A1* | 10/2008 | Koorapaty et al. | 375/341 |
| 2009/0097454 A1* | 4/2009 | Yeou et al. | 370/332 |
| 2009/0175387 A1* | 7/2009 | Park et al. | 375/340 |

(Continued)

FOREIGN PATENT DOCUMENTS

| CN | 1399828 A | 2/2003 |
|---|---|---|
| CN | 1534879 A | 10/2004 |

(Continued)

OTHER PUBLICATIONS

Cao, Lei; Chen, Chang Wen: "A Novel Product coding and Decoding Scheme for Wireless Image Transmission," proceedings of the IEEE ICIP 2000 conference, Vancouver, Canada, (Sep. 10-13, 2000), pp. 144-147 (XP2285555).

(Continued)

Primary Examiner — John J Tabone, Jr.
(74) Attorney, Agent, or Firm — Charles Chesney

(57) ABSTRACT

A method and apparatus for decoding encoded data bits of a wireless communication transmission are provided. A set of a-priori bit values corresponding to known bit values of the encoded data bits may be generated. Decoding paths that correspond to decoded data bits that are inconsistent with the a-priori bit values may be removed from the possible decoding paths to consider, and decoding the encoded data bits by selecting a decoding path from remaining decoding paths of the possible decoding paths that were not removed. A-priori bit values may be extracted from various messages, such as DL-MAP, UL-MAP, RNG-REQ, and BW-REQ messages.

30 Claims, 38 Drawing Sheets

U.S. PATENT DOCUMENTS

| | | | |
|---|---|---|---|
| 2009/0175388 A1* | 7/2009 | Chang et al. | 375/341 |
| 2009/0239585 A1* | 9/2009 | Huss | 455/561 |
| 2009/0268700 A1* | 10/2009 | Son et al. | 370/336 |
| 2010/0020904 A1* | 1/2010 | Tran | 375/341 |
| 2010/0182958 A1* | 7/2010 | Hole | 370/329 |
| 2010/0281346 A1* | 11/2010 | Choi et al. | 714/784 |

FOREIGN PATENT DOCUMENTS

| | | |
|---|---|---|
| EP | 1467492 | 10/2004 |
| EP | 1885069 A1 | 2/2008 |
| JP | 2003505975 A | 2/2003 |
| JP | 2011509042 A | 3/2011 |
| RU | 2179367 C2 | 2/2002 |
| WO | WO2007021224 | 2/2007 |
| WO | WO2007139462 | 12/2007 |
| WO | WO2009088534 | 7/2009 |

OTHER PUBLICATIONS

International Search Report and Written Opinion—PCT/US2008/070385, International Search Authority—European Patent Office—Nov. 13, 2008.

Jong IL Park et al: "A protocol aided concatenated forward error control forwireless ATM" IEEE Wireless Communications and Networking Conference, 2002, vol. 2, Mar. 17, 2002, pp. 613-617, XP010585665 ISBN: 978-0-7803-7376-1.

IEEE "Corrigendum to IEEE Standard for Local and Metropolitan Area Networks—Part 16: Air Interface for Fixed Broadband Wireless Access Systems," Draft Standard, Sep. 12, 2005, 288 pages, P802.16/2004/Cor1/D5, New York, New York.

IEEE P802.16e/D12 Oct. 2005, Draft IEEE Standard for Local and Metropolitan area networks, Part 16: Air Interface for Fixed Broadband Wireless Access Systems, Amendment for physical and Medium Access Control Layers for Combined Fixed and Mobile Broadband Wireless Access Systems, Amendment for Physical and Medium Access Control Layers for Combined Fixed and Mobile Operation in licensed Bands pp. i-658, Oct. 14, 2005.

P802.16/REVd/D5: "Draft IEEE Standard for Local and metropolitan area networks, Part 16: Air Interface for Fixed Broadband Wireless Access Systems," pp. 1-915 (May 13, 2004).

\* cited by examiner

| FCH/DLFP MESSAGE FORMAT ||||
|---|---|---|---|
| FIELD | SIZE (BITS) | NOTES | COMMENTS |
| Bitmap | 6 | Bit(m) corresponding to Major Group m. Value 1 means used by this segment and Value 0 means not used. Example Bit(0)='1' then MG0 is used in this seq. Bit(0:5)='11111' then MG0~MG5 are used | Variable info Predictable info |
| Reserved | 1 | Reserved field. Shall be set to '0' | Fixed info |
| Repetition type | 2 | Indicate repetition type used on DL MAP 0b00: No repetition. Repetition factor 1 0b01: Repetition factor 2 0b10: Repetition factor 4 0b11: Repetition factor 6 | Variable info |
| Coding type | 3 | Indicate coding type used on DL MAP 0b000: TBCC 0b001: BTC 0b010: CTC 0b011: ZTCC 0b100: LDPC 0b101~0b111: Reserved | Variable info Predictable info |
| Length | 8 | Define the length in slots of the DL MAP | Variable info. Predictable info |
| Reserved | 4 | Reserved field. Shall be set to '0000' | Fixed info |

FIG. 13

| L0 HYPOTHESIS: API 0BITS/24BITS ||||
|---|---|---|---|
| FIELD | SIZE (BITS) | Resulting API (x is unknown) | COMMENTS |
| Bitmap | 6 | XXXXXX | |
| Reserved | 1 | X | |
| Repetition type | 2 | XX | |
| Coding type | 3 | XXX | |
| Length | 8 | XXXXXXXX | |
| Reserved | 4 | XXXX | |

FIG. 14A

| L1 HYPOTHESIS: API 5BITS/24BITS ||||
|---|---|---|---|
| FIELD | SIZE (BITS) | Resulting API (x is unknown) | COMMENTS |
| Bitmap | 6 | XXXXXX | |
| Reserved | 1 | 0 | |
| Repetition type | 2 | XX | |
| Coding type | 3 | XXX | |
| Length | 8 | XXXXXXXX | |
| Reserved | 4 | 0000 | |

FIG. 14B

| L2 HYPOTHESIS: API 6BITS/24BITS ||||
|---|---|---|---|
| FIELD | SIZE (BITS) | Resulting API (x is unknown) | COMMENTS |
| Bitmap | 6 | 1XXXXX | Seg 0 is identified in preamble |
| Reserved | 1 | 0 | |
| Repetition type | 2 | XX | |
| Coding type | 3 | XXX | |
| Length | 8 | XXXXXXXX | |
| Reserved | 4 | 0000 | |

FIG. 14C

| L3 HYPOTHESIS: API 11BITS/24BITS |||| 
|---|---|---|---|
| FIELD | SIZE (BITS) | Resulting API (x is unknown) | COMMENTS |
| Bitmap | 6 | 111111 | All are used in prev. frame |
| Reserved | 1 | 0 | |
| Repetition type | 2 | XX | |
| Coding type | 3 | XXX | |
| Length | 8 | XXXXXXXX | |
| Reserved | 4 | 0000 | |

FIG. 14D

| L4 HYPOTHESIS: API 13BITS/24BITS ||||
|---|---|---|---|
| FIELD | SIZE (BITS) | Resulting API (x is unknown) | COMMENTS |
| Bitmap | 6 | 111111 | All are used in prev. frame |
| Reserved | 1 | 0 | |
| Repetition type | 2 | XX | |
| Coding type | 3 | 0X0 | TBCC(0B000) or CTC(0B010) |
| Length | 8 | XXXXXXXX | |
| Reserved | 4 | 0000 | |

FIG. 14E

| L5 HYPOTHESIS: API 15BITS/24BITS ||||
|---|---|---|---|
| FIELD | SIZE (BITS) | Resulting API (x is unknown) | COMMENTS |
| Bitmap | 6 | 111111 | All are used in prev. frame |
| Reserved | 1 | 0 | |
| Repetition type | 2 | XX | |
| Coding type | 3 | 0X0 | TBCC(0B000) or CTC(0B010) |
| Length | 8 | 00XXXXXX | Assume L< 2^6 |
| Reserved | 4 | 0000 | |

FIG. 14F

| L6 HYPOTHESIS: API 17BITS/24BITS ||||
|---|---|---|---|
| FIELD | SIZE (BITS) | Resulting API (x is unknown) | COMMENTS |
| Bitmap | 6 | 111111 | All are used in prev. frame |
| Reserved | 1 | 0 | |
| Repetition type | 2 | XX | |
| Coding type | 3 | 0X0 | TBCC(0B000) or CTC(0B010) |
| Length | 8 | 0000XXXX | Assume L< 2^4 |
| Reserved | 4 | 0000 | |

FIG. 14G

METHODS AND SYSTEMS FOR A-PRIORI DECODING BASED ON MAP MESSAGES

BACKGROUND

1. Field

Certain embodiments of the present invention generally relate to wireless communications and, more particularly, to decoding wireless transmissions.

2. Description of the Related Art

The rapid growth in wireless communications services, such as broadband Internet access and streaming media applications, leads to an increasing demand for higher data rates. Advancements in multiplexing schemes, such as Orthogonal Frequency Division Multiplexing (OFDM) and Orthogonal Frequency Division Multiple Access (OFDMA), are important for next generation wireless communications systems. This is due to the fact that such schemes can provide many advantages including modulation efficiency, spectrum efficiency, flexibility (e.g., allowing differentiated quality of service), and strong multi-path immunity over conventional single carrier modulation schemes.

OFDM and OFDMA systems often utilize convolutional encoders at the transmitter to provide for error correction. Using a convolutional code, an m-bit string of data is transformed into n-bits, where m/n is a coding rate. Decoders, such as Viterbi decoders, are used at the receiver to decode the received encoded n-bits to recover the original m-bit sequence. This scheme often allows the original m-bit sequence to be decoded correctly, even if one or more of the encoded n-bits is not received correctly, thus resulting in reductions in bit error rate.

However, with the ever increasing reliability and performance demands of wireless services, there is an ongoing need to continuously reduce bit error rates.

SUMMARY

Certain embodiments provide a method for decoding encoded data bits of a wireless communication transmission for a MAP message. The method generally includes generating a hypothesis specifying a set of bit values of the encoded data bits based on a-priori information regarding at least one of: the content of the MAP message and a parameter of a related transmission and decoding the transmission by eliminating from consideration sets of decoded bits that are inconsistent with the specified bit values and selecting, as output, decoded bits that are consistent with the bit values specified by the hypothesis.

Certain embodiments provide a receiver for wireless communication generally including a receiver front end for receiving a wireless transmission for a message and generating a set of encoded bits, a Hypothesis Engine, and a decoder. The Hypothesis Engine configured to generate one or more hypotheses, each specifying a set of bit values of the encoded data bits based on a-priori information regarding the message. The decoder configured to decode the encoded bits by eliminating from consideration sets of decoded bits that are inconsistent with the bit values specified by the hypotheses and selecting, as output, decoded bits consistent with bit values specified by one of the hypotheses.

Certain embodiments provide an apparatus for wireless communications. The apparatus generally includes means for receiving a wireless transmission for a message and generating a set of encoded bits, means for generating one or more hypotheses, each specifying a set of bit values of the encoded data bits based on a-priori information regarding the message, and means for decoding the encoded bits by eliminating from consideration sets of decoded bits that are inconsistent with the bit values specified by the hypotheses and selecting, as output, decoded bits consistent with bit values specified by one of the hypotheses.

Certain embodiments provide a mobile device generally including a receiver front end for receiving a wireless transmission for a MAP message and generating a set of encoded bits, a Hypothesis Engine, and a decoder. The Hypothesis Engine is configured to generate one or more hypotheses, each specifying a set of bit values of the encoded data bits based on a-priori information regarding at least one of: content of the MAP message or a previously decoded MAP message. The decoder is configured to decode the encoded bits by eliminating from consideration sets of decoded bits that are inconsistent with the bit values specified by the hypotheses and selecting, as output, decoded bits consistent with bit values specified by one of the hypotheses.

BRIEF DESCRIPTION OF THE DRAWINGS

So that the manner in which the above recited features of the present invention can be understood in detail, a more particular description of the invention, briefly summarized above, may be had by reference to certain embodiments, some of which are illustrated in the appended drawings. It is to be noted, however, that the appended drawings illustrate only certain embodiments of this invention and are therefore not to be considered limiting of its scope, for the invention may admit to other equally effective embodiments.

FIG. 13 illustrates an example message format that may be used to generate decoding hypotheses based on a-priori information bits.

FIGS. 14A-14G illustrate different decoding hypotheses based on a-priori information bits.

DETAILED DESCRIPTION

Figure 1:
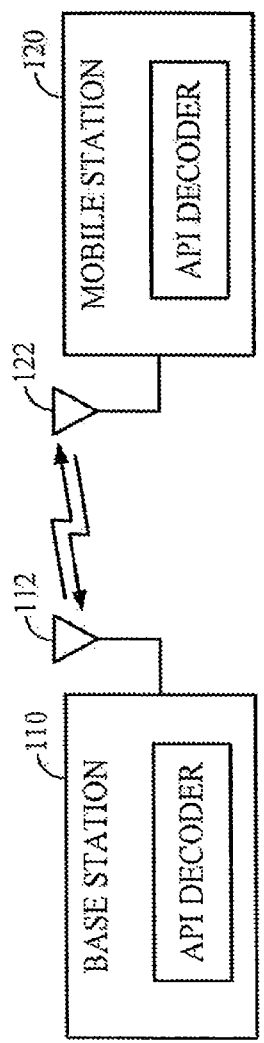
FIG. 1 illustrates an example wireless system in accordance with certain embodiments of the present invention.

The present invention generally provides techniques and apparatus for decoding convolutionally encoded wireless transmissions using a-priori information regarding a transmission. The a-priori information may be used to effectively reduce the population of possible decoded bit streams by eliminating those that include bits that are not consistent with the a-priori information. By removing these "known wrong" paths that lead to erroneous data, decoded bit error rates may be improved in some situations.

As used herein, the term a-priori information generally refers to information known beforehand, such as, information proceeding from a known or assumed cause to a necessarily related effect. As will be described in greater detail below, examples of a-priori information related to a transmission include known information bits in certain messages. Examples of such known information bits include reserved bits with values, as specified by a standard or bits that have known or predictable values based on their value in previous transmissions. These known bit positions and bit values (herein referred to as "API values") may be used in decoding process to improve decoding performance by excluding paths that correspond to values that are in contrast to the API values.

An Exemplary Wireless Communication System

The methods and apparatus of the present disclosure may be utilized in a broadband wireless communication system. The term "broadband wireless" refers to technology that provides wireless, voice, Internet, and/or data network access over a given area.

WiMAX, which stands for the Worldwide Interoperability for Microwave Access, is a standards-based broadband wireless technology that provides high-throughput broadband connections over long distances. There are two main applications of WiMAX today: fixed WiMAX and mobile WiMAX. Fixed WiMAX applications are point-to-multipoint, enabling broadband access to homes and businesses, for example. Mobile WiMAX offers the full mobility of cellular networks at broadband speeds.

Mobile WiMAX is based on OFDM (orthogonal frequency-division multiplexing) and OFDMA (orthogonal frequency division multiple access) technology. OFDM is a digital multi-carrier modulation technique that has recently found wide adoption in a variety of high-data-rate communication systems. With OFDM, a transmit bit stream is divided into multiple lower-rate sub-streams. Each sub-stream is modulated with one of multiple orthogonal sub-carriers and sent over one of a plurality of parallel sub-channels. OFDMA is a multiple access technique in which users are assigned subcarriers in different time slots. OFDMA is a flexible multiple-access technique that can accommodate many users with widely varying applications, data rates, and quality of service requirements.

The rapid growth in wireless internets and communications has led to an increasing demand for high data rate in the field of wireless communications services. OFDM/OFDMA systems are today regarded as one of the most promising research areas and as a key technology for the next generation of wireless communications. This is due to the fact that OFDM/OFDMA modulation schemes can provide many advantages such as modulation efficiency, spectrum efficiency, flexibility, and strong multipath immunity over conventional single carrier modulation schemes.

IEEE 802.16x is an emerging standard organization to define an air interface for fixed and mobile broadband wireless access (BWA) systems. IEEE 802.16x approved "IEEE P802.16-REVd/D5-2004" in May 2004 for fixed BWA systems and published "IEEE P802.16e/D12 Oct. 2005" in October 2005 for mobile BWA systems. Those two standards defined four different physical layers (PHYs) and one media access control (MAC) layer. The OFDM and OFDMA physical layer of the four physical layers are the most popular in the fixed and mobile BWA areas respectively.

An Example Environment

FIG. 1 illustrates an example system in which embodiments of the present invention may be utilized to process a wireless signal from a base station 110 to a mobile station 120. The base station 110 may be a wireless communications station installed at a fixed location, such as a cellular telephone tower. The mobile station 120 may be any suitable type user equipment (UE) capable of communicating with the base station 110, such as a cellular handset or other type mobile device.

The base station 110 and mobile station 120 may communicate using one or more antenna 112, 122, each, and using any suitable wireless communication technology employing modulation schemes, such as orthogonal frequency-division multiplexing (OFDM) and orthogonal frequency division multiple access (OFDMA). For some embodiments, the communications between the base station and mobile station may be partially or fully compliant with a variety of Institute of Electrical and Electronics Engineers (IEEE) standards, such as IEEE 802.16 (Worldwide Interoperability for Microwave Access-WiMAX) and 802.20 (Mobile Broadband Wireless Access-MBWA) family of standards.

In some applications, the base station 110 may transmit data to the mobile station over what is commonly referred to as a forward link, while the mobile station 120 transmits data to the base station 120 over a reverse link. As will be described in greater detail below, different types of a-priori information may be available for forward and reverse link transmissions. This a-priori information may include information regarding the timing and content of certain messages between the base station 110 and mobile station 120, which may result in the value of one or more bits in a transmission being known.

The techniques described herein may be utilized in decoding performed at the base station 110, mobile station 120, or both. As will be described in greater detail below, a-priori information about different types of messages transmitted between the base station 110 and 120 may be used to determine the value of particular bit locations with in a transmission.

Figure 2:
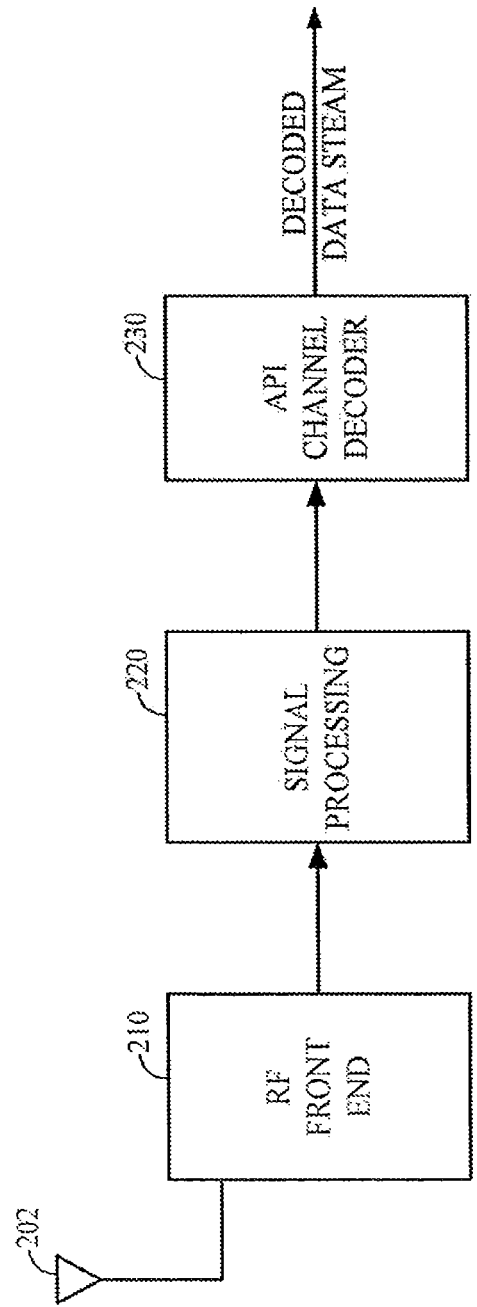
FIG. 2 is a block diagram of a wireless receiver in accordance with certain embodiments of the present invention.

FIG. 2 illustrates a block diagram of example components for one embodiment of a receiver capable of receiving the transmitted signals. One or more antenna 202 may receive transmitted signals from a transmitter and send them to a radio frequency (RF) front end 210. The RF front end 210 may include any suitable circuits for receiving the transmitted signals and preparing them for digital signal processing, such as automatic gain control (AGC), a fast Fourier transform (FFT) block, a channel estimator, and a carrier-to-interference-and-noise ratio (CINR) estimator.

Signals from the RF front end 210 may then be sent to a signal processing block 220, which may contain any suitable circuits for subcarrier de-allocation, signal demapping, and the like. The output of the signal processing block 220 is a set of encoded bits. The encoded bits are forwarded to a channel decoder 230, which may decode the encoded bits using a-priori information about the corresponding transmission.

A-Priori Decoding

Figure 3:
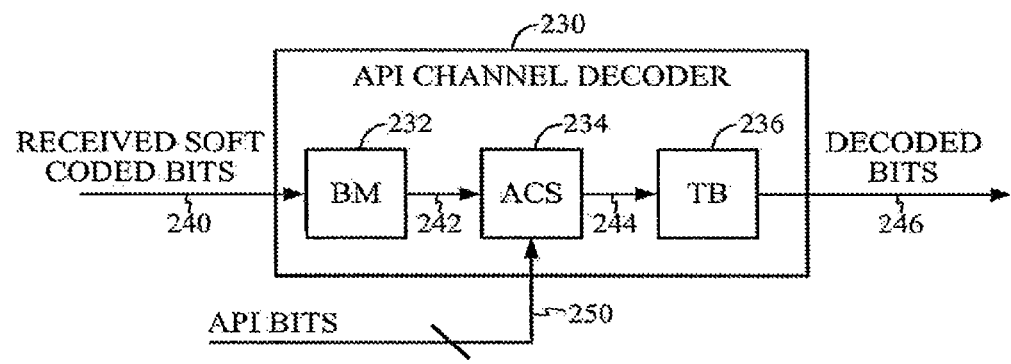
FIGS. 3 and 4 illustrate block diagrams of a-priori decoders in accordance with certain embodiments of the present invention.

FIG. 3 is a block diagram of a decoder 230 capable of performing decoder operations based on a-priori information in accordance with an embodiment of the present invention. While the illustrated example shows a Viterbi decoding scheme as an example, the a-priori decoding techniques presented herein may also be applied to other type of decoding schemes, such as Turbo coding/decoding, low-density parity-check (LDPC) coding/decoding, RS coding/decoding, BCH coding/decoding, and various other schemes.

In the case of schemes that utilize systematic codes, coded bits may include systematic bits (information before encoding) and parity bits (redundancy bits resulting from encoding). API decoding scheme may be applied to the systematic bits. In other words, API bit values may include known values of the systematic bits based on the particular systematic codes used. To apply API for systems utilizing systematic codes, bits of received data may be replaced with (known/predicted) API bit values at the front end of the decoder. In this manner, the probability of successful decoding may be increased using API for systematic decoders.

The decoder 230 includes a branch metric unit 232, add compare select (ACS) logic 234, and a traceback (TB) unit 236 to generate a set of decoded bits 246 from a set of "soft (or hard)" received/encoded bits 240. The branch metric unit generally functions to calculate branch metrics, which represent normalized distances between a received symbol (set of bits) and symbols in a code alphabet. The ACS unit 234 generally compiles branch metric data to generate metrics for decoding paths (2K–1 paths, assuming a constraint length of K) and selects one of these decoding paths as optimal. The results of these selections are written to memory of a traceback unit 236, which restores a path from the stored decisions. A set of decoded bits can then be generated based on the transitions of the restored path.

One or more of the decoder components may be controlled by a set of API bits 250 in order to prevent the selection of decoding paths that correspond to bit values that are inconsistent with the a-priori information. In other words, the API bits 250 may contain sufficient information to indicate particular values ("0" or "1") that are known for certain bit locations in a sequence of bits being decoded. Any bit string that has a value other than the value specified in the API bits 250 is not a valid decoded bit string. Thus, the decoder may remove decoding paths corresponding to these invalid bit strings from consideration during path selection.

Figure 4:
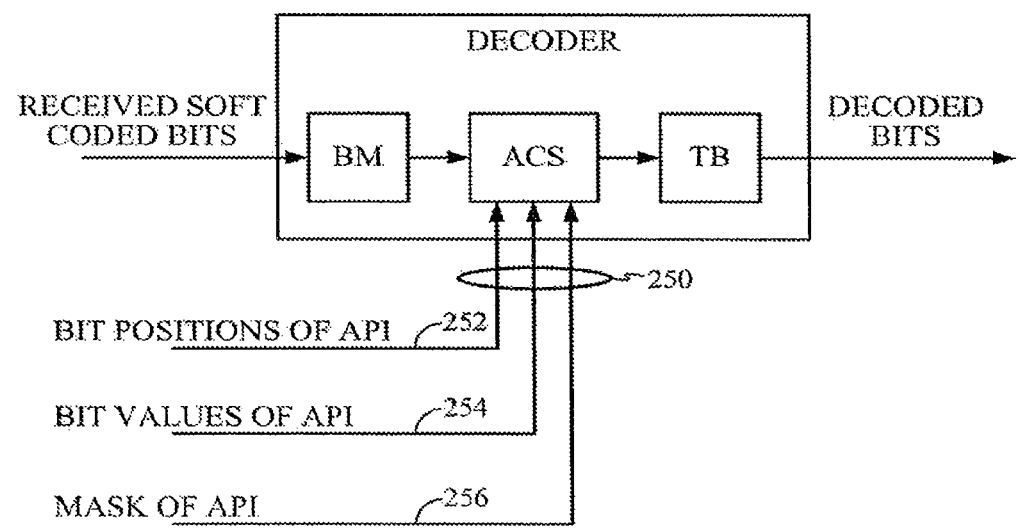

As illustrated in FIG. 4, for some embodiments, the ACS unit 234 may be controlled by API bits 250 in order to exclude decoding paths that correspond to invalid decoded bit strings. During ACS operation, the API bits 250 may be used to reduce particular decoding path transitions that correspond to encoded bit values that are inconsistent with the API values.

The API bits 250 generally include sufficient information to identify one or more bits in a decoded bit string that have bit values that are known (or predictable) based on a-priori information and, additionally, what those bit values are. The actual format in which this information is conveyed may vary with different embodiments and according to actual implementation schemes.

Figure 7:
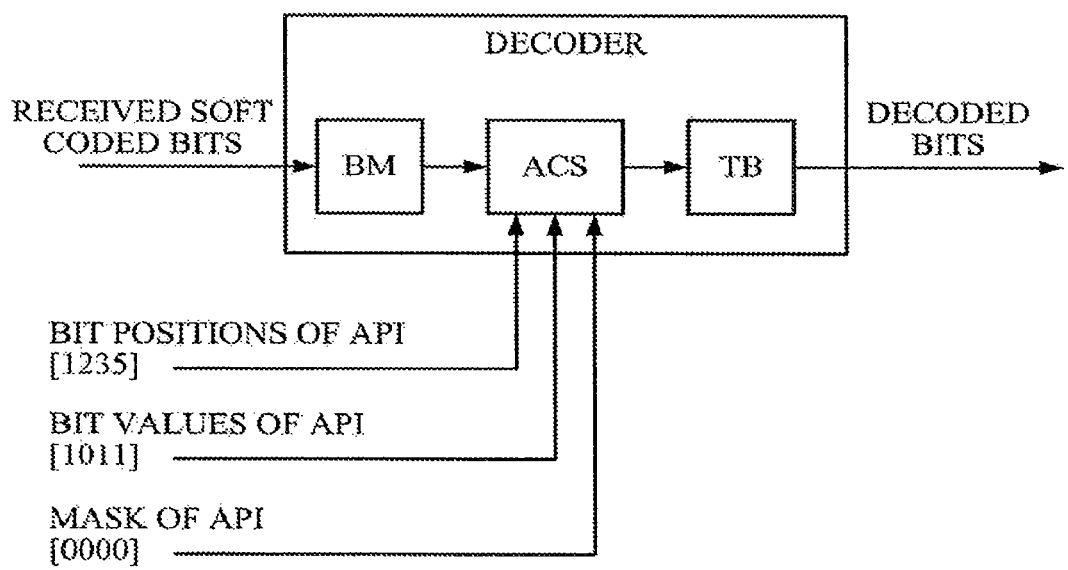
FIG. 7 illustrates the decoder of FIG. 5 with example values of a-priori information bits.

For example, for some embodiments, the API bits 250 may include three types of information: an indication of bit positions 252, bit values 254, and, optionally, API mask bits 256. The bit positions 252 may provide an indication of bit locations (within an encoded sequence) that have known values, while the bit values 254 provide the actual known values ("0" or "1") of an encoded bit. FIG. 7, described in detail below, provides an illustration with example values for bit positions, bit values, and mask bits according to this format.

The API bit positions 252 may identify bit positions correspond to the position of a known/predicted encoded bit in trellis structure. According to one embodiment, the API bit positions 252 may explicitly identify bit positions that have known values, while all other bit positions are considered "unknown." The corresponding bit value of "0" or "1" in the bit values 254 may thus be used to identify valid transitions in the trellis structure and effectively remove decoding paths involving invalid transitions.

Figure 5:
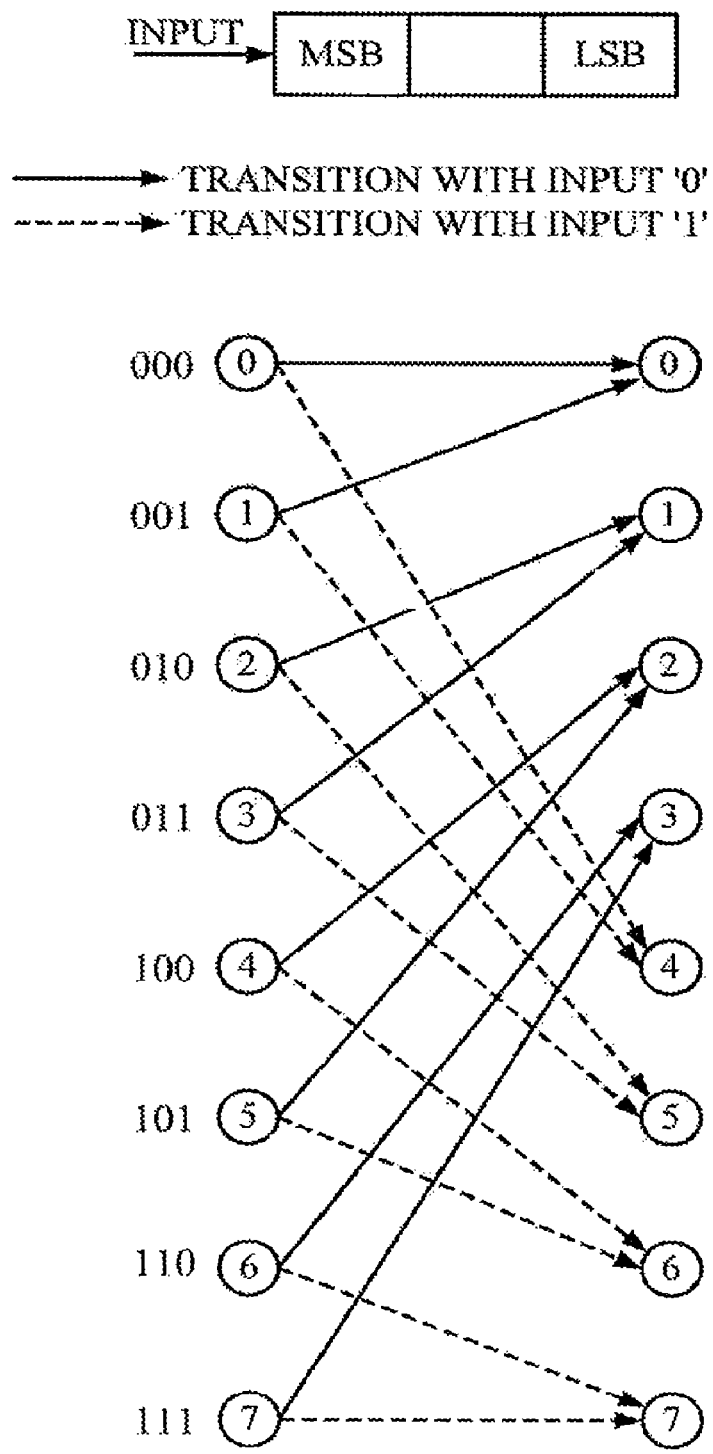
FIG. 5 illustrates an example of a state transition of a trellis diagram in accordance with certain embodiments of the present invention.

For example, FIG. 5 illustrates an example of a state transition of a trellis structure with 3-bit states. The illustrated example assumes a coding rate of ½ and a K=4 (with a 3-bit, K–1, state register). Solid arrows indicate state transitions corresponding to a "0" input bit, while dashed arrows indicate state transitions corresponding to a "1" input bit. According to API decoding, state transitions that correspond to input bits that are inconsistent with known values may be eliminated from consideration, thereby effectively eliminating any paths including these transitions from the final selection.

As an example, if a known API bit value for this state were a "0," the state transitions with solid lines will be evaluated, while the state transitions with dashed lines do not need to be calculated because they are part of invalid paths that should not be considered for selection. As described above, these transitions may be effectively eliminated at the next transition by setting the value of a state metric to a worst case value. In addition to reducing bit error rate by eliminating invalid paths from selection, eliminating the number of transitions based on API bit values can also reduce the number of computations in the ACS unit.

For certain embodiments, a mask function may be realized by utilizing the API mask bits 256 to identify bit positions whose API bit value should be ignored. Such a mask function may be useful and add flexibility, for example, when a standard changes causing a previously known bit value to become unknown. Setting the mask bit may provide a simple mechanism to efficiently accommodate such changes. A mask function may also be realized by manipulating the API bit positions 252 to remove the identification of a bit position that no longer has a known value, thus providing an alternative to changing a value in the bit mask value and/or eliminating the need for the bit mask value at all.

Figure 6:
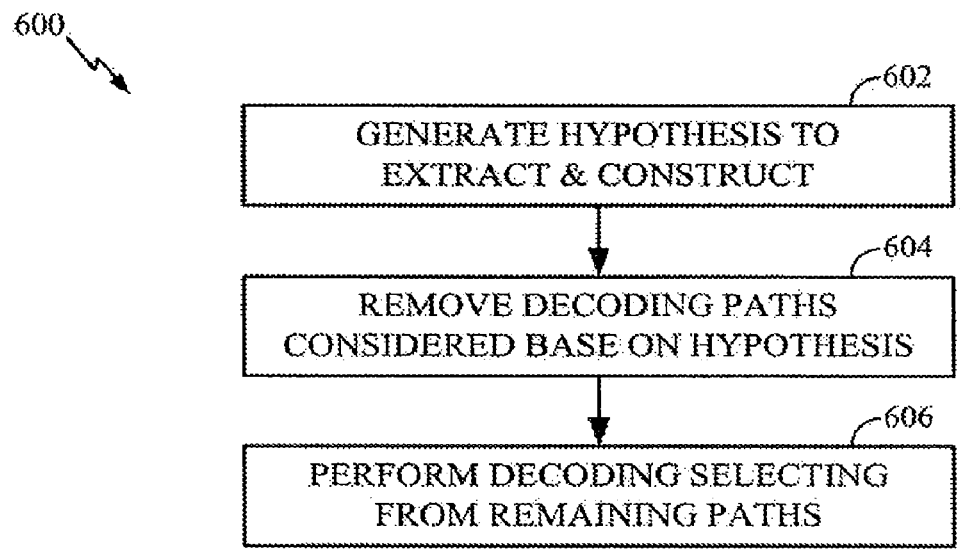
FIGS. 6 and 6A are flow diagrams of example operations for a-priori decoding in accordance with certain embodiments of the present invention.

FIG. 6 illustrates example operations 600 for API decoding. The operations begin, at 602, by generating a hypothesis based on a-priori information. At 604, decoding paths that result in bit values inconsistent with the API bit values of the hypothesis are removed. Finally, at 606, decoding is performed based on a selection of one of the remaining paths.

As used herein, the term hypothesis generally refers to a particular set of API bits, for example, indicating bit positions with known values and specifying the values for those bits. As will be described in greater detail below, for certain embodiments, separate logic (referred to herein as a "Hypothesis Engine") may be provided to generate one or more hypotheses, for example, based on message information from a MAC Processor.

FIG. 7 illustrates one example of a hypothesis for a 6-bit stream applied to an API decoder. The illustrated hypothesis indicates, via API bit position values [1 2 3 5], that API bit values are present at bit positions 1, 2, 3, and 5 for use in decoding. According to the illustrated scheme, the corresponding API bit values [1 0 1 1] indicate the bit values for bits at these positions are: bit1=1, bit2=0, bit3=1, and bit5=1. For certain embodiments, API mask bit values of [0 0 0 0] may be used indicate that no masking function is applied to any of the bits. On the other hand, to exclude a bit from the API decoding, a mask bit could be set, for example to [0 0 0 1] to mask bit position 5, resulting in effective bit values of [1 0 1 X].

Of course, API mask functionality may be realized by controlling the API bit position values, as well. As an example, bit position 5 may also be effectively masked out by removing 5 from the bit position values, resulting in bit position values of [1 2 3], with corresponding API bit values [1 0 1]. In this scheme, API bit positions may be effectively masked without the need for a separate mask value data structure.

In an alternative scheme, only the API bit values and corresponding API mask values may be used. As an example, it may be assumed that all positions in a bit sequence are used for API decoding, for example, by default or by express indication of all bit positions in the API position value (e.g., [1 2 3 4 5 6]). In either case, the API mask values may be used to identify bit positions that have no corresponding API bit values. For example, the API mask value of [0 0 0 1 0 1] may be used with the "1" values indicating the API bit values corresponding to bit positions 4 and 6 should be ignored, resulting in corresponding API bit values of [1 0 1 X 1 X].

Figure 8:
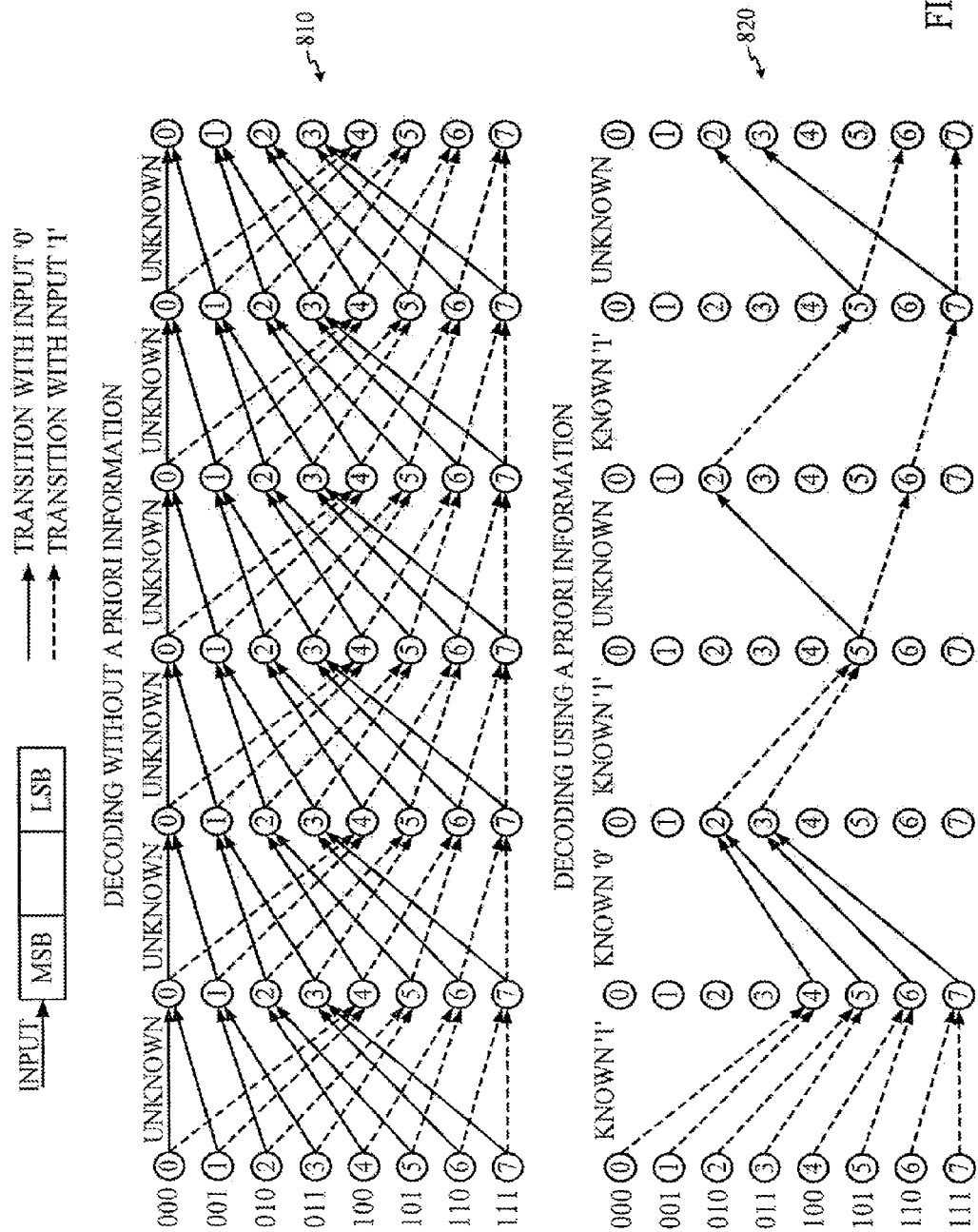
FIG. 8 illustrates an example of a Trellis diagram with a full set of decoding paths and a set of decoding paths that has been reduced based on a-priori information bits, in accordance with certain embodiments of the present invention.

FIG. 8 illustrates how the API bit values of the hypothesis shown in FIG. 7 may be applied to reduce the number of decoding paths considered during decoding. The top diagram 810 shows all possible paths through the diagram that would be considered in a conventional decoding scheme that assumes all input bits are unknown. As illustrated by the bottom diagram 820, however, an API decoding scheme searches a greatly reduced number of paths, having eliminated a number of path transitions based using the known API bit values.

The reduction in paths based on the API bit values may be explained by traversing the diagram 820 from left to right. The known API values for the corresponding transitions are listed across the top. For the first transition, the bit value is a known "1" resulting in removal of the solid line path transitions corresponding to a zero input bit. This results in transitions to state nodes 100b, 101b, 110b and 111b.

The second transition corresponds to a known bit value of "0" resulting in removal of the dashed line path transitions. This results in transitions to state nodes 010b and 011b. The third transition corresponds to a known bit value of "1" resulting in removal of the solid line path transitions. This results in transitions to a single state node 101b.

The bit value for the fourth transition, however, is unknown. Therefore, both possible transition paths are evaluated. This results in transitions to state nodes 010b and 110b. The fifth transition corresponds to a known bit value of "1" resulting in removal of the solid line path transitions. This results in transitions to state nodes 101b and 111b. The bit value for the sixth transition is again unknown. Therefore, both possible transition paths are evaluated, resulting in transitions to state nodes 010b and 110b from state node 101b and transitions to state nodes 011b and 111b from state node 111b.

Branch metrics for these remaining paths can be evaluated to select an optimal path and generate the corresponding set of decoded bits. By eliminating decoding paths that correspond to invalid bit sequences, bit/packet error rates may be improved using API decoding, with greater improvements expected in noisier environments.

Figure 9:
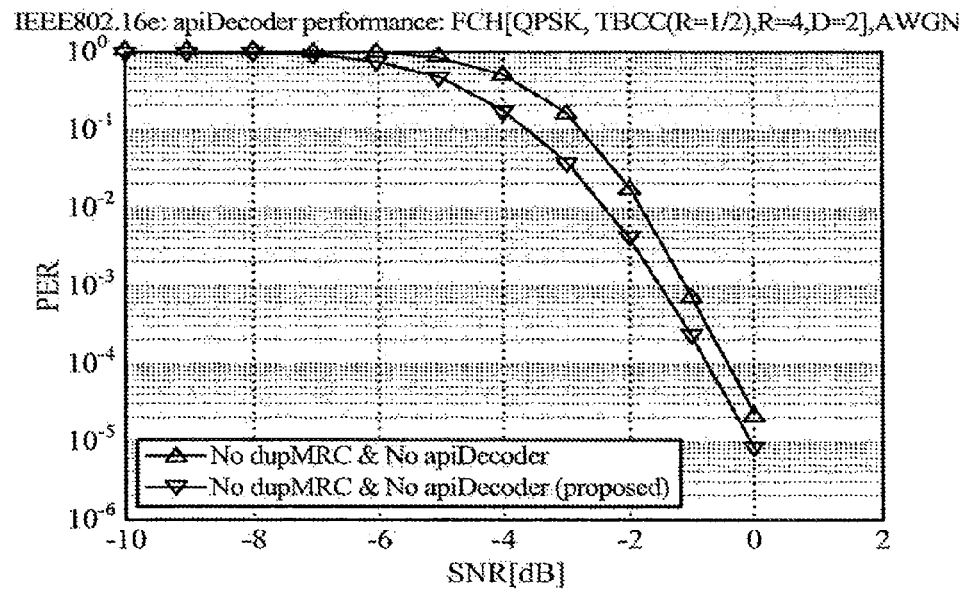
FIG. 9 illustrates example results of decoding considering a first set of a-priori information, in accordance with certain embodiments of the present invention.

FIG. 9 is an example graph of packet error rate (PER) versus signal to noise ratio (SNR) for simulated decoding a frame control header (FCH)/downlink frame prefix (DLFP) message of IEEE 802.16e standard. This type of message contains 24 bits of information. Of these, 5 bits are reserved bits that are to be set to zero per the standard. In the simulated example, these 5 reserved bits are used as a-priori information, with known bit values of "0" at the corresponding locations in the 24 bit string. The simulation also assumes modulation and coding as follows: QPSK, TBCC(r=½), with a repetition factor of 4 and a duplication factor of 2, and assumes repetition Maximum Ratio Combining (MRC) on the receive side (RX).

As illustrated, the API decoding scheme shows improved performance relative to the conventional decoding scheme in AWGN environments. For example, the API decoding scheme shows about a 0.6 dB gain in PER $10^{-2}$ in AWGN channel when compared with conventional decoding (without considering API).

Figure 10:
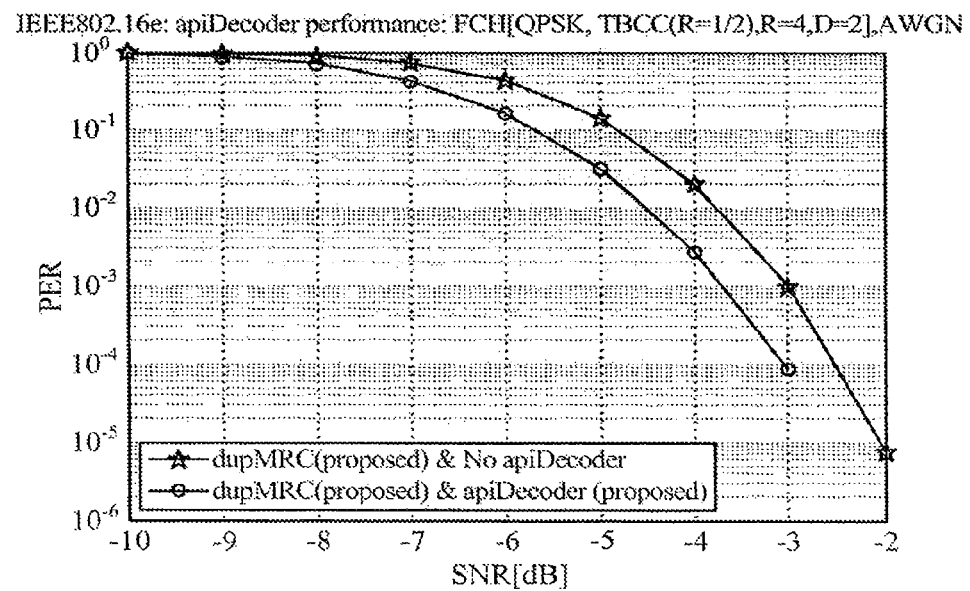
FIG. 10 illustrates example results of decoding considering a first set of a-priori information, in accordance with certain embodiments of the present invention.

FIG. 10 is a similar diagram to FIG. 9, but the corresponding simulation assumes both repetition Maximum Ratio Combining (MRC) and duplication on the receive side (RX). As illustrated, in this example, an API decoding scheme shows an approximate 0.75 dB gain at PER $10^{-2}$ in AWGN channel compared to without API decoding scheme.

Hypothesis Engine

As described above, for certain embodiments, a Hypothesis Engine may be provided to generate "hypotheses" that each includes a set of API bit values to use in performing API decoding. Depending on a particular implementation, a Hypothesis Engine may generate a single hypothesis or multiple hypotheses that may differ in which bits have known values and what those bit known values are. Evaluating multiple hypotheses may be useful, for example, when there are only a limited number of valid bit combinations, for a given sequence.

Figure 11:
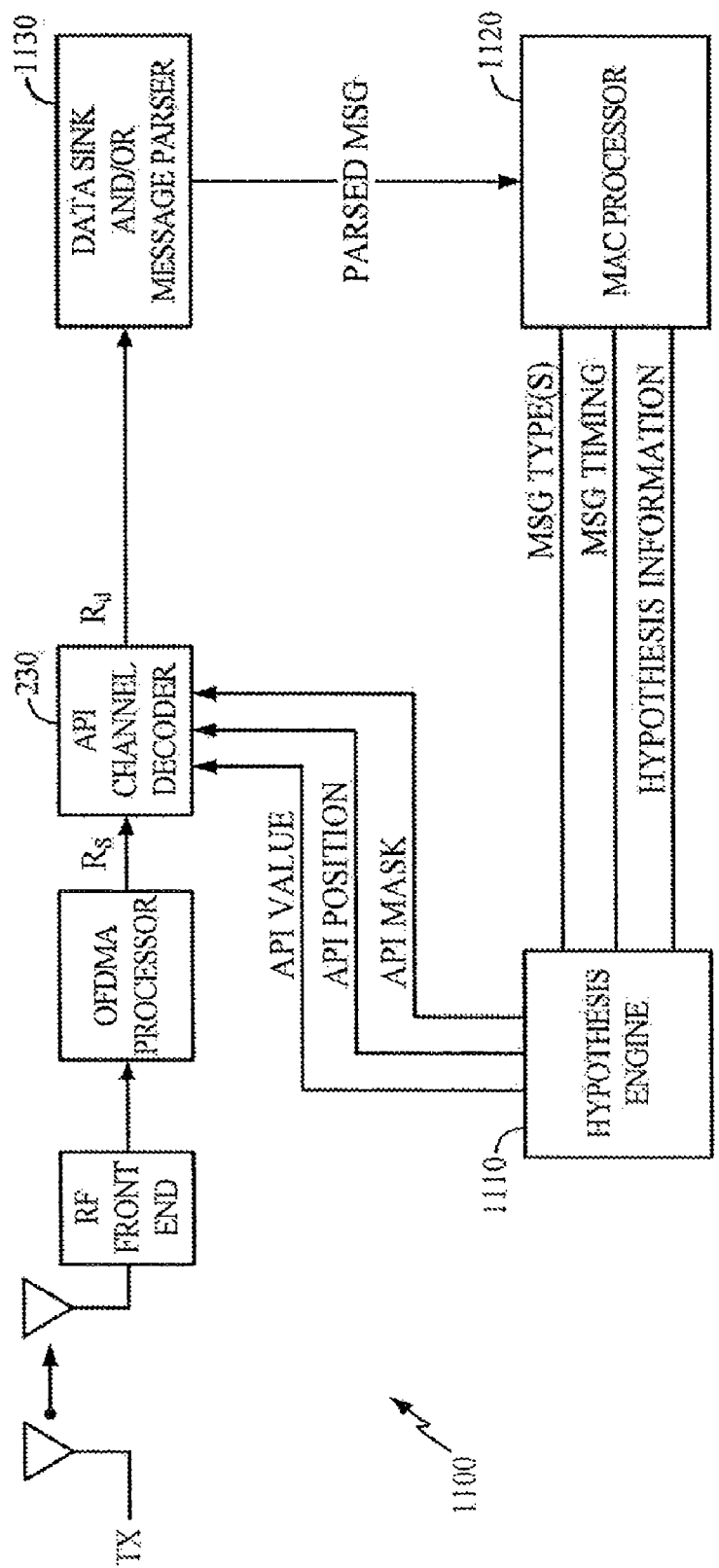
FIG. 11 is a block diagram of a receiver with an a-priori decoder and Hypothesis Engine in accordance with certain embodiments of the present invention.

FIG. 11 illustrates a receiver circuit 1100 that includes an API decoder 230 and a Hypothesis Engine 1110. As illustrated, the Hypothesis Engine 1110 may receive information regarding a message from a medium access control (MAC) processor 1120 and generates API bit values (a hypothesis) for use by the API decoder 230. The API decoder 230 starts to decode received soft (or hard) bits Rs using the API bit values provided by the Hypothesis Engine 1110. The API decoder 230 outputs decoded data bits Rd, which are delivered to a message parser 1130.

If the message parser 1130 detects that the decoded bits are for a kind of message, the message is parsed and delivered to a MAC (medium access control) processor 1120. The MAC Processor 1120 may function as a type of protocol analyzer, analyzing the received data, for example, in an effort to determine what the next possible message type(s) are and what the timing will be.

As an example, the MAC Processor 1120 may recognize the first incoming message (or data) will be FCH/DLFP message, which is followed by a downlink preamble. In some cases, the MAC Processor 1120 may use some information from a previous frame, for example, to determine a coding rate, message length, or some other parameter. The MAC Processor 1120 may provide this information to the Hypothesis Engine 1110 that will use it to extract known bit values (or predict bit values) for particular bit locations and generate API information to forward to the API decoder.

Figure 12:
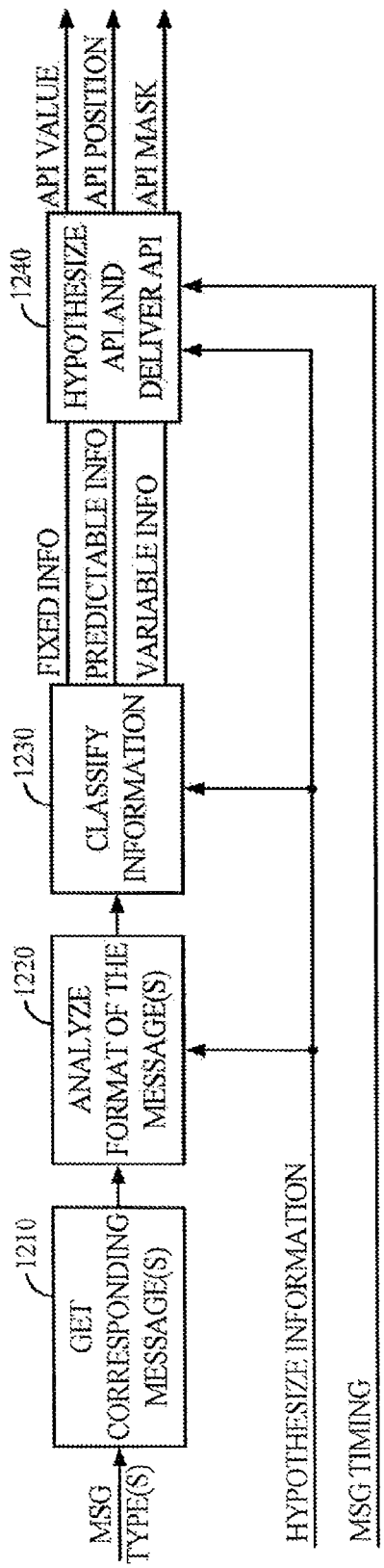
FIG. 12 is a block diagram of a Hypothesis Engine in accordance with certain embodiments of the present invention.

FIG. 12 illustrates an example Hypothesis Engine 1110 that may be used to generate decoding hypotheses based on a-priori information and message information provided by the MAC Processor 1120. As illustrated, the Hypothesis Engine receives an indication of a message type and includes logic 1210 to retrieve the corresponding message(s) designated by the message type and the format of the message(s) are analyzed by format logic 1220.

For certain embodiments, in addition to bit locations with fixed/known bit values (such as reserved bits set to a known value according to a standard), hypotheses may be generated with information that is predictable. As an example, bit information may be predictable based on a value from a previously received message (e.g., a coding type may not likely change from one message to the next).

Thus, classify logic 1230 may classify bit information in a given message into at least three categories: fixed information, predictable information, and variable information. The fixed (known) information generally refers to information that is fixed so that it is known 100% from initial stage or some bit values that are known under some conditions (e.g., after checking the decoding results of related messages). For example, the decoded results of messages relating to data to be decoded, such as messages or data that are known to be positioned before the data to be decoded, may be analyzed and API information may be extracted from the analyzed data.

The predictable information may include information that can be predictable under certain conditions or assumptions so it could provide different candidate values or bit combinations for a set of one or more bits. Different candidate values may be included in different hypotheses. For example, the predictable information may include some information predictable under certain conditions or assumptions or information that is predictable after checking decoding results of related messages.

Variable information generally includes information that is unknown or too difficult to predict so it is generally not used as API bit values (e.g., the API bit position values for these bit locations may be set to "0"). After classifying the information bits, Hypothesis API and Delivery logic 1240 of the hypotheses engine may generate a set or sets of API bit values (each set corresponding to a hypothesis) using the classified information. For example, the logic 1240 may construct the API bit location, bit value, and mask strings, to be output to the decoder 230.

The API decoding scheme presented herein may be applied to a variety of different types of messages. For example, API decoding may be applied to (FCH) Downlink Frame Prefix (DLFP) messages, as described below, Normal Downlink MAP (DL-MAP) messages, Compressed DL-MAP messages, Uplink MAP (UL-MAP) messages, Bandwidth Request (BW-REQ) messages, Initial Ranging Request (IRNG-REQ) messages, and so on.

A frame control header (FCH) Downlink Frame Prefix (DLFP) message 1300, as depicted in FIG. 13, provides a good example of various bits of information that may be classified as fixed, predictable, and variable. The format and content of a FCH message is defined in IEEE 802.16e OFDMA standard. The DLFP is the contents of an FCH channel. The DLFP is a data structure transmitted at the beginning of each frame and contains information regarding the current frame and is mapped to the FCH. Therefore, successful decoding of the DLFP is very important to process a whole frame. The classification of some bits may change over time, for example, after a transition from an initial acquisition state to detecting a first message frame.

As an example, a bitmap field 1310 includes 6 bits, with each bit indicating whether a corresponding message group is used by a segment. In an initial acquisition state, these bits are unknown. However, after initial decoding and identifying a message segment, at least one of the bits will be identified (e.g., assuming the first message group bit is used API bits="1XXXXX"). Further, in a normal operation state, the mobile station can predict all 6 of the bits, assuming the base station sends the same bitmap as in the previous frame.

As described earlier, bits of the reserved fields 1320 and 1322 will remain fixed so long as the standard is not changed. In contrast, the 2 bits of the repetition type field 1330 are difficult to predict and can change from frame to frame.

The 3-bit coding type field 1340 may be classified in different ways and used to generate a number of different hypotheses. For example, without placing any conditions on the types of coding, the 3-bit field could be treated as variable. However, using a-priori information some of these bits may be treated as fixed. For example, if it is known that a current version of WiMax supports only two types of coding, TBCC (0b000) and CTC (0b010), the first and third bits may be treated as known bit values of "0" (API bits="0b0X0").

While the 8-bit length field 1350 may vary from frame to frame, some of the bits may be classified in different manners. As an example, imposing no limitation on the length field all 8 bits would be variable. However, in most cases, a length of a DL-MAP will be less than $2^7$, such that the MSB may be predicted to be a "0" (API bits="0b0XXXXXXX"). While this prediction may not be true, the improvement in bit error rate achieved may outweigh any performance penalty in having to re-decode using a different hypothesis. More aggressive hypotheses may also be generated in a similar manner, for example, assuming the length is less than 2^6 (API bits="0b00XXXXXX") or less than 2^4 (API bits="0b0000XXXX").

FIGS. 14A-14G illustrate multiple API decoding hypothesis examples for the FCH/DLFP message, based on the information and possible classifications and assumptions described above. The hypotheses are referred to as having different levels (L0-L6) that generally represent how "aggressive" the hypothesis is, based on the number of bits that are treated as having known bit values.

Referring first to FIG. 14A, the L0 hypothesis corresponds to the case of no API bit values (no hypothesis), as in the case of the first message in each frame. In other words, because a message has not been decoded, there is no message information that may be used to generate API values. FIG. 14B illustrates the first level (L1) hypothesis, with only the reserved bit values used in the hypothesis.

FIG. 14C illustrates the L2 hypothesis, which includes the reserved bit values plus a bitmap bit value (the message group indicated in the first frame) used in the hypothesis. FIG. 14D illustrates the L3 hypothesis which, relative to the L2 hypothesis, adds the remaining bitmap bit values that were used in the previous frame.

FIG. 14E illustrates the L4 hypothesis which, relative to the L3 hypothesis, adds coding field bit values that are common to the supported coding types TBCC and CTC. FIG. 14F illustrates the L5 hypothesis which, relative to the L4 hypothesis, adds the upper two bits of the length field based on the assumption the length is less than 2^6. FIG. 14G illustrates the L6 hypothesis which, relative to the L5 hypothesis, adds two more bits of the length field, based on the assumption that the length is less than 2^4.

The bit values for each of these hypotheses may be used by the API decoder to reduce a number of decoding paths that correspond to erroneous data, in the manner described above. Of course, the hypotheses shown in FIGS. 14B-14G are exemplary only. Further, while the illustrated hypotheses get progressively more aggressive, including more known bit values, those skilled in the art will recognize that other hypotheses may be generated using different combinations of the bit values shown in these examples.

Figure 15:
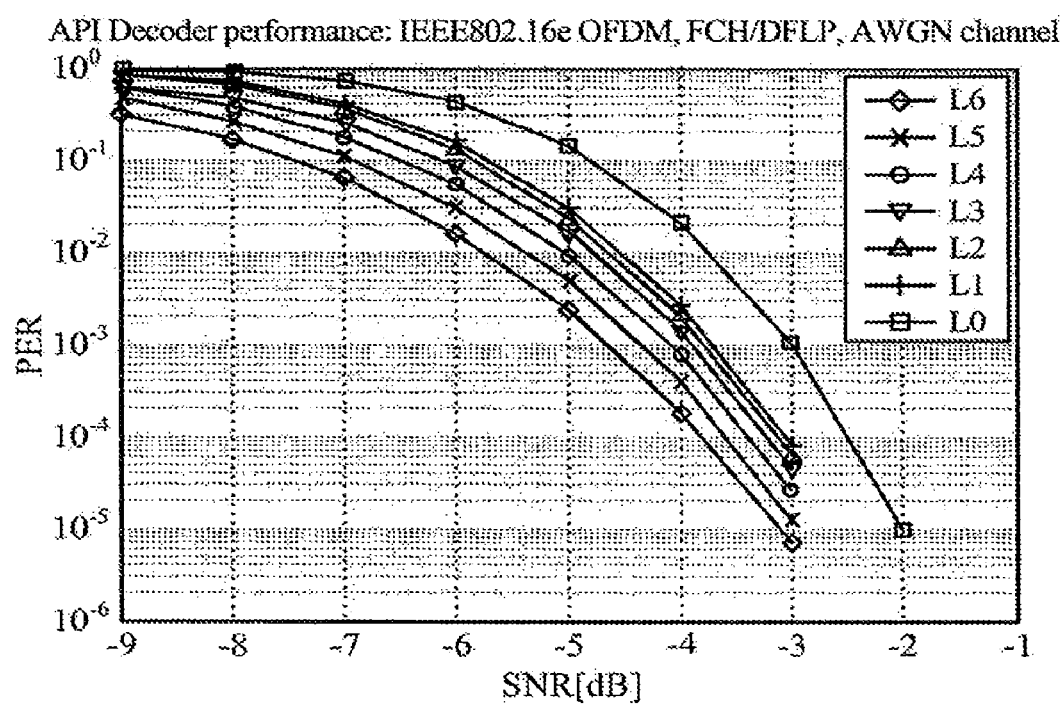
FIG. 15 illustrates example results of decoding for different API hypotheses, in accordance with certain embodiments of the present invention.
Figure 16:
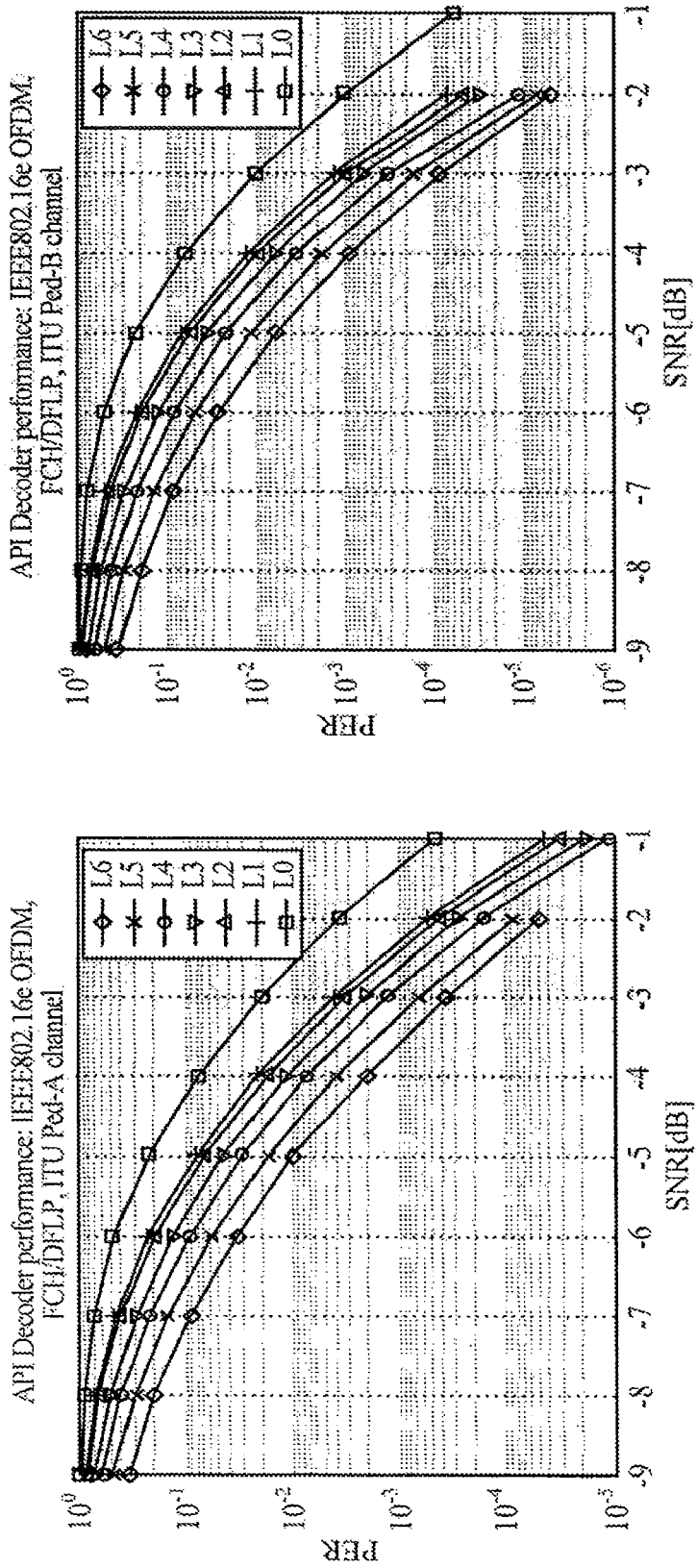
FIG. 16 illustrates example results of decoding for different API hypotheses, in accordance with certain embodiments of the present invention.
Figure 17:
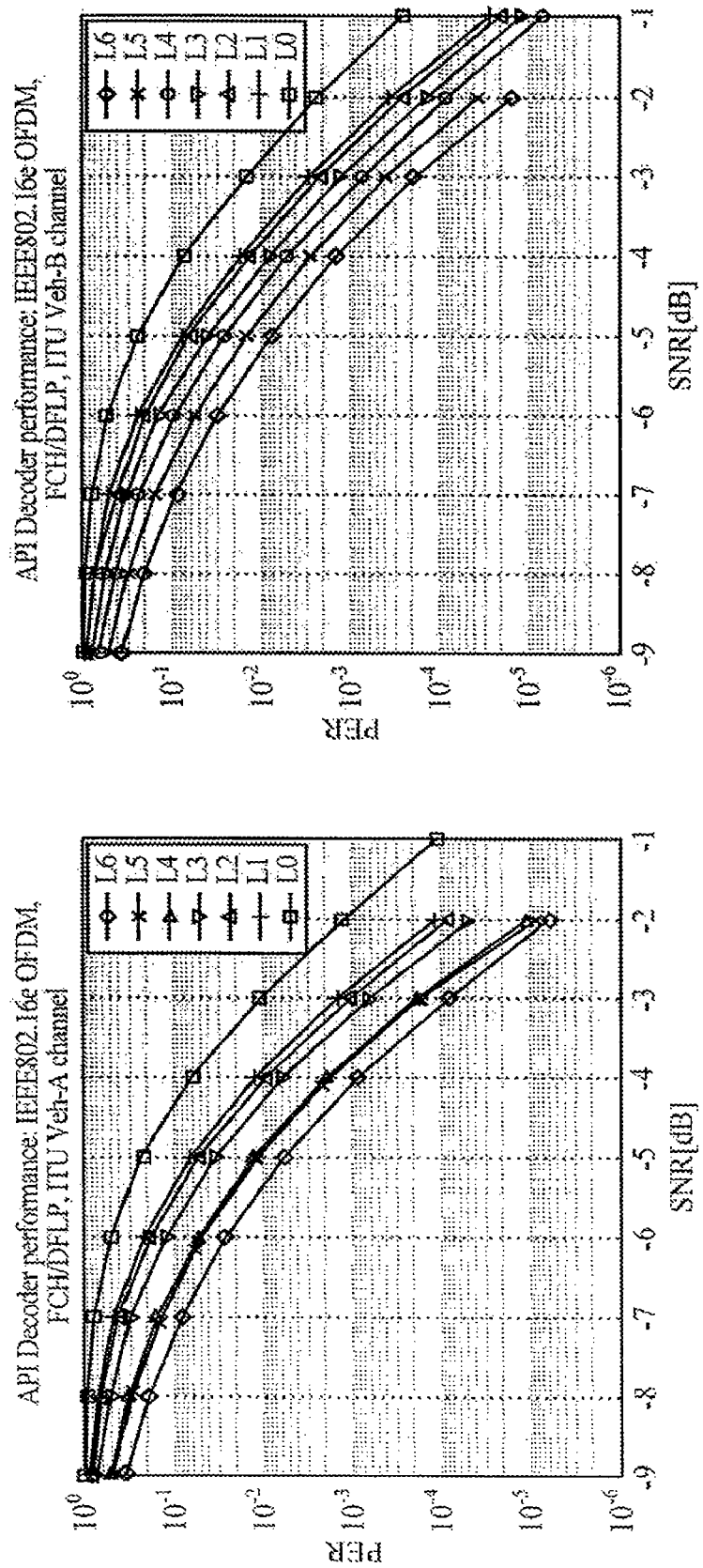
FIG. 17 illustrates example results of decoding for different API hypotheses, in accordance with certain embodiments of the present invention.

As described above, the API bit values according to these different hypotheses may be used by the API decoder to remove decoding paths that correspond to erroneous data. Because the different hypotheses have different API bit values, the decoding performance may vary from hypothesis to hypothesis. FIGS. 15-17 show example graphs that illustrate the performance variations between the different hypotheses over different channels.

FIG. 15 shows simulation results of API decoding for different hypotheses L0-L6 in an Additive White Gaussian Noice (AWGN) channel. In the simulation, it is assumed that all hypotheses are correct (in other words, it is assumed that the API bit values match the actual encoded bit values).

As illustrated, hypotheses with more API bits yield better performance (reduced bit error rates). FIG. 16 shows similar results, for API decoding using the different hypothesis for ITU Ped-A and Ped-B channels. FIG. 17 shows similar results, for API decoding using the different hypothesis for ITU Veh-A and Veh-B channels.

While the foregoing is directed to certain embodiments of the present invention, other and further certain embodiments of the invention may be devised without departing from the basic scope thereof, and the scope thereof is determined by the claims that follow.

Methods of Processing Multiple Hypotheses

As discussed above, a Hypothesis Engine generates a hypothesis of bit values based on both fixed and predictable a-priori information. The Hypothesis Engine may use predictable information to generate Nc multiple hypotheses by assuming different combinations of bit values. To increase performance it may be desirable to process multiple hypotheses. Accordingly, the decoder may investigate multiple delivered hypotheses. Thus, the number of processed hypotheses may equal the number of delivered hypotheses, Nc. Where there are multiple processed hypotheses, only the most accurate hypothesis may be selected.

In certain embodiments a received message may contain a cyclic redundancy check (CRC) field. For messages that lack a CRC, the selection criteria may be based on an accumulated likelihood (or accumulated distance) at the final stage of decoding. For messages that have CRC, the selection criteria may be based on either the results of the CRC check or the accumulated likelihood.

There are several methods that may be utilized to evaluate multiple hypotheses. These methods may include parallel, sequential and iterative evaluation. To implement a parallel evaluation method, a plurality of decoders is utilized with each decoder processing one or more of the Nc API hypotheses.

In contrast, the sequential and iterative decoding methods may utilize a single decoder to process a single hypothesis at a time. In the sequential method the decoder processes all hypotheses in a loop that is Nc long, while in the iterative method the decoder processes a series of hypotheses until it finds one hypothesis that meets a predetermined selection criteria threshold.

In certain embodiments, the number of hypotheses may exceed the number of processors. In such embodiments, a hybrid method may be utilized in which each processor operates in parallel, but each processor evaluates more than one hypothesis in a sequential or iterative manner.

Figure 18:
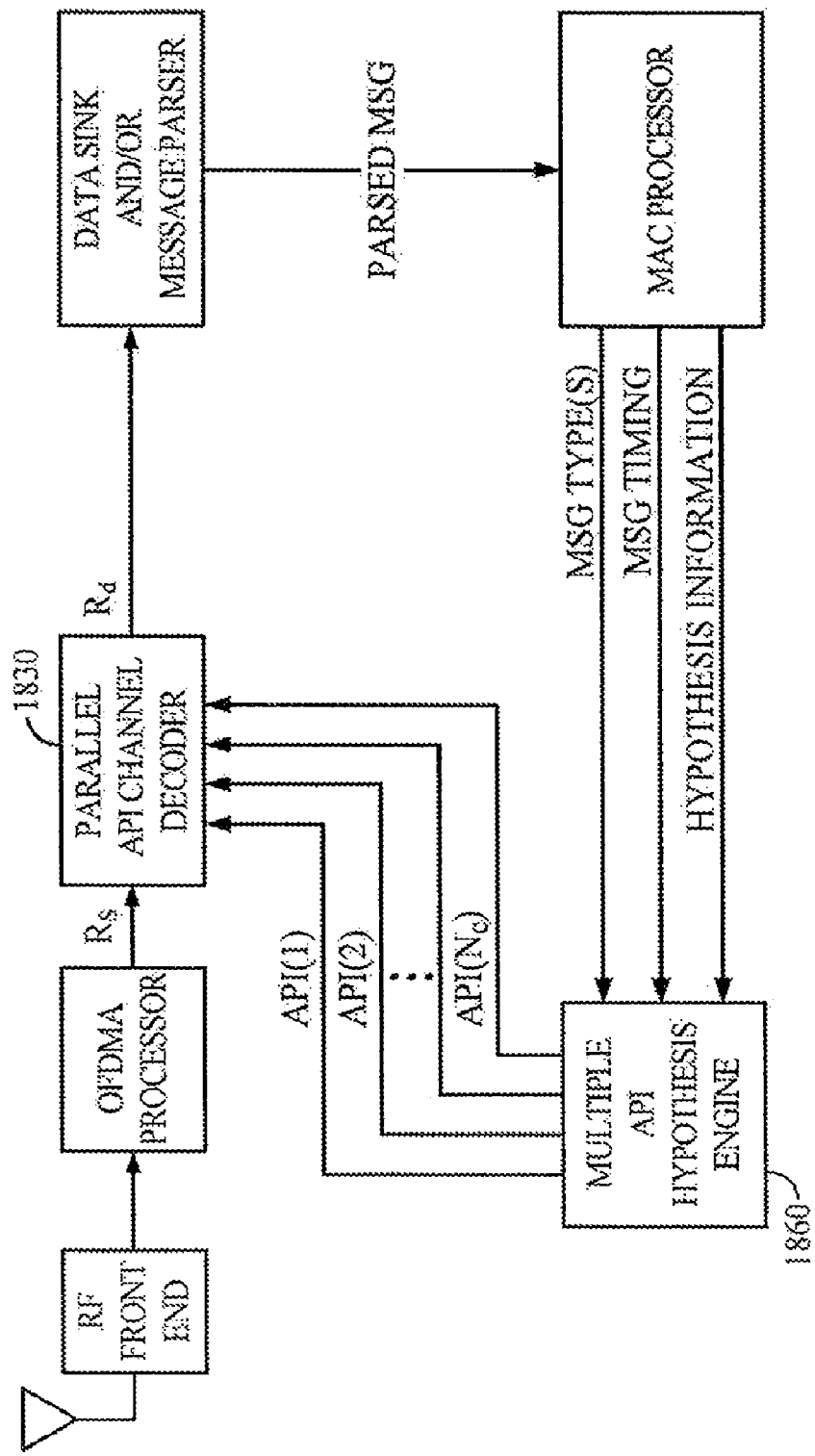
FIG. 18 illustrates an example receiver capable of evaluating multiple decoding hypotheses in parallel.

FIG. 18 illustrates a receiver circuit that includes a parallel API decoder 1830 and a Hypothesis Engine 1860 that generates multiple hypotheses.

As illustrated, the Hypothesis Engine 1860 may generate $N_C$ different hypotheses, each having a different set of API bit values API(1) to API($N_C$), based on message information received from a MAC Processor. The Hypothesis Engine may generate the multiple hypotheses, for example, based on different assumptions used to predict bit values. As described above, some of the hypotheses may be considered more aggressive than others, for example, based on the number of bit values that are predicted.

The decoder 1830 decodes received bits Rs using the API bit values of the different hypotheses, in effect, decoding the received bits multiple times in parallel by applying the different hypotheses. After evaluating the multiple hypotheses, the decoder 1830 may output decoded data bits $R_D$ obtained using the hypothesis deemed to be the best based on some type of selection criteria.

Figure 19:
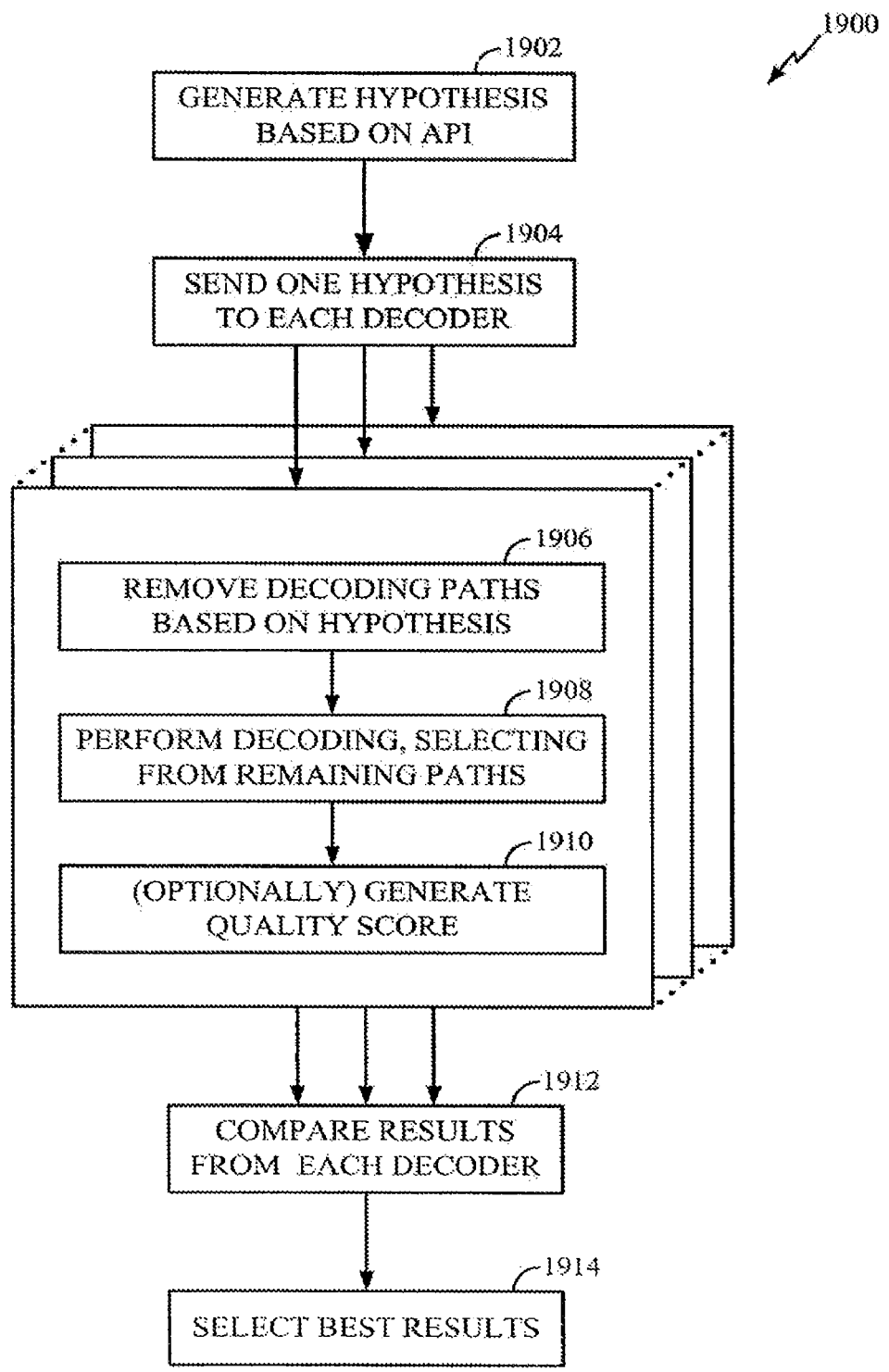
FIG. 19 illustrates example operations for evaluating multiple decoding hypotheses in parallel.

FIG. 19 illustrates example operations 1900 for evaluating multiple hypotheses in parallel. The operations 1900 may be described with reference to FIG. 20, which illustrates an example embodiment of the parallel decoder 1830 having a plurality of API decoders 2000 arranged in parallel.

Figure 20:
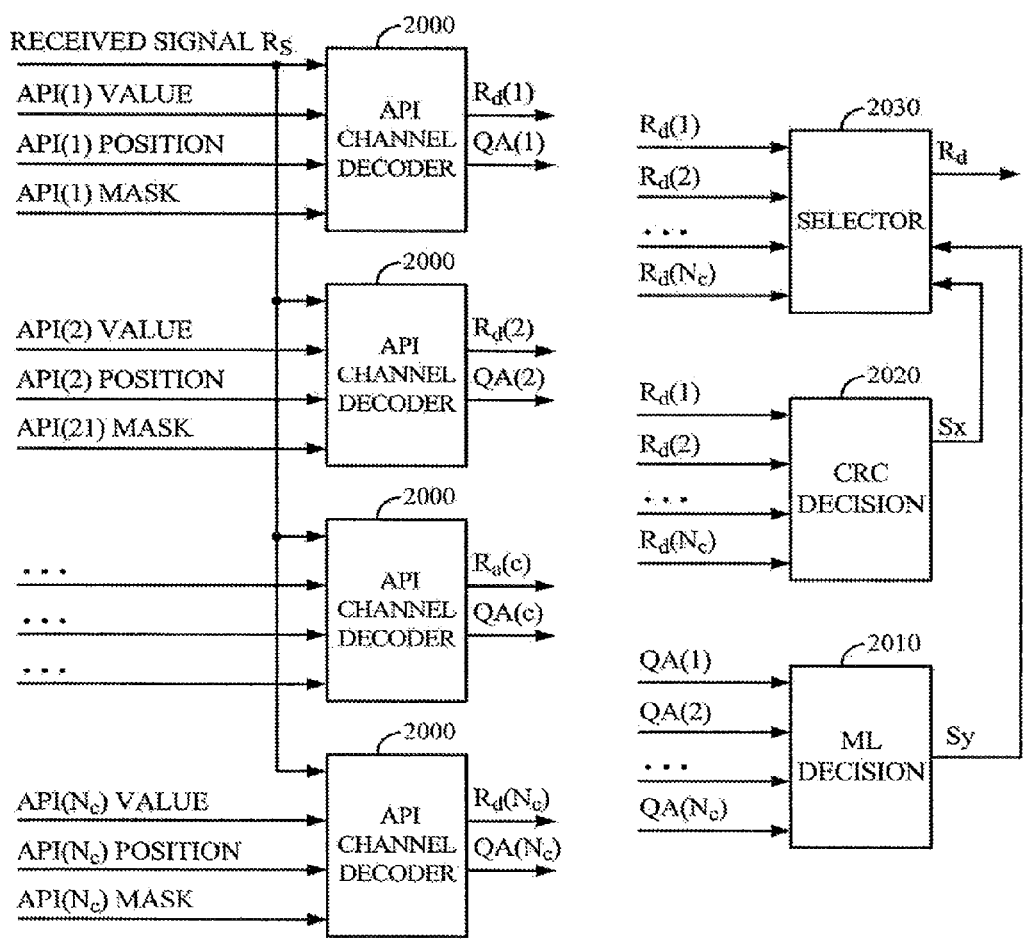
FIG. 20 illustrates an example decoder capable of evaluating multiple decoding hypotheses in parallel.

The operations begin, at 1902, by generating a plurality of hypotheses based on a-priori information. At 1904, each hypothesis may be sent to one of the decoders 2000. As illustrated in FIG. 20, each hypothesis may include the types of information described above (e.g., bit values, bit locations, and/or bit masks) to be used by the decoder in decoding the received bits $R_S$.

Each decoder performs API decoding, at steps 1906 and 1908, removing decoding paths based on the API bit values of the corresponding hypothesis and selecting from remaining paths to generate a set of decoded bits $R_D$. At 1910, each decoder may generate a quality metric (QA) that may be used to select a best hypothesis, for example, in the event the decoded message does not include a CRC. If the message does contain a CRC, a separate quality metric may or may not be generated. At 1912, the decoding results from each decoder are compared and, at step 1914, results obtained using the best hypothesis are selected.

As illustrated in FIG. 20, if the message being decoded contains a CRC, the decoding results may be compared by performing a CRC check with CRC logic 2020. The CRC logic 2020 may generate an output ($S_X$) identifying a hypothesis with decoded results that had a matching CRC. The output $S_X$ may be used to control select logic 2030 that serves as a multiplexor, to output the corresponding decoded results.

As an alternative to a CRC check (e.g., if a decoded message does not have a CRC), the quality metric may be used to select a best hypothesis. The quality metric may be, for example, an accumulated distance or likelihood value. ML decision logic 2010 may evaluate the quality metric from each decoder, generating an output ($S_Y$) identifying a hypothesis with decoded results that had the best quality metric (e.g., the lowest accumulated distance or the highest likelihood). The output $S_Y$ may be used to control the select logic 2030 to output the corresponding decoded results.

Figure 21:
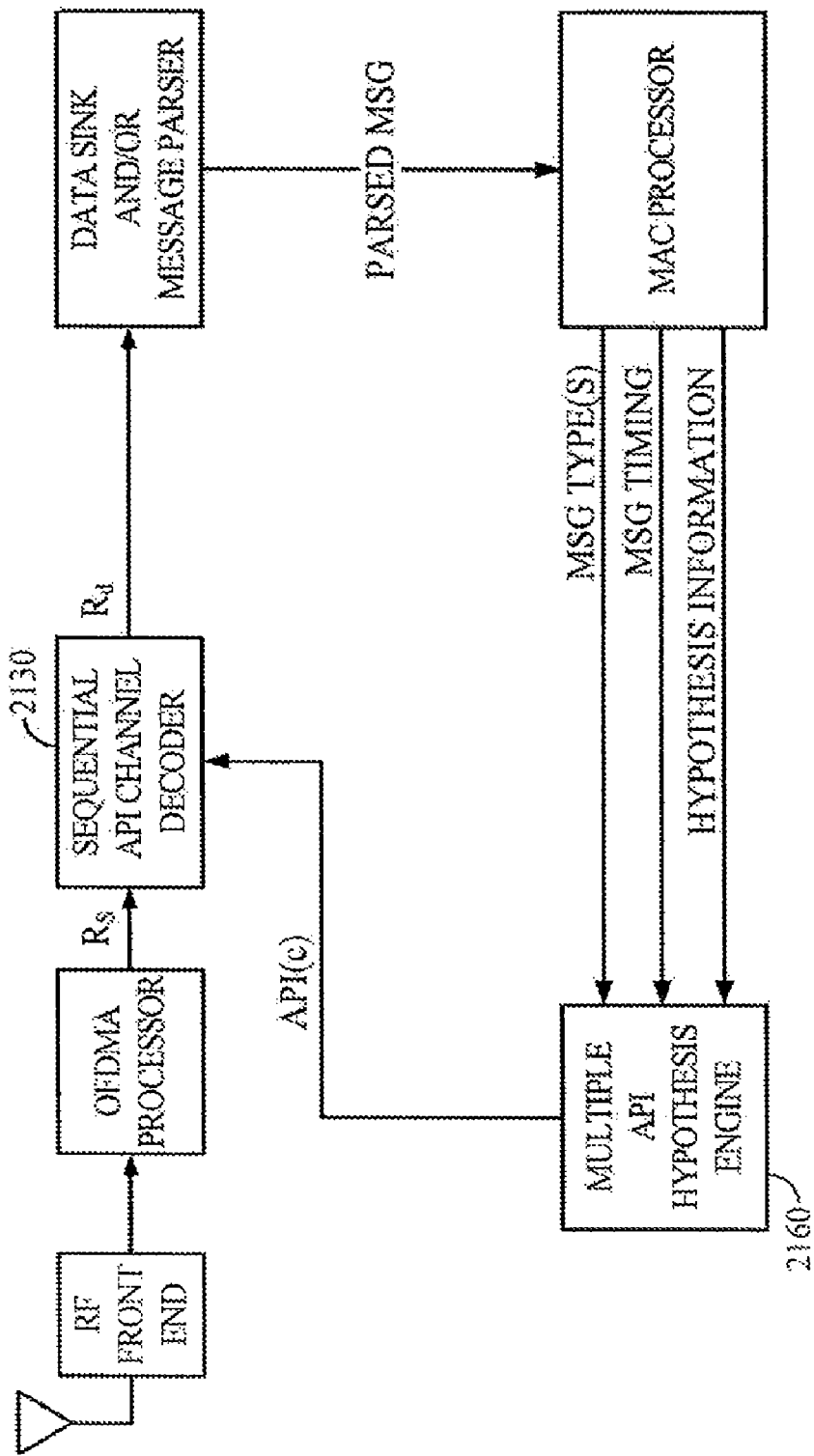
FIG. 21 illustrates an example receiver capable of evaluating multiple decoding hypotheses in a sequential manner.

FIG. 21 illustrates a receiver circuit that includes a sequential API decoder 2130 and a Hypothesis Engine 2160 that generates multiple hypotheses.

As illustrated, the Hypothesis Engine 2160 may generate $N_C$ different hypotheses, and output these hypotheses in a sequential manner to the decoder 2130. For example, as illustrated, the Hypothesis Engine 2160 may output the API bit values, API(c) to the decoder 2130, where c=1 to $N_C$.

The decoder 2130 decodes received bits Rs using the API bit values of the different hypotheses, in effect, decoding the received bits multiple times in serial by applying the different hypotheses. After evaluating the multiple hypotheses, the decoder 2130 may output decoded data bits $R_D$ obtained using the hypothesis deemed to be the best based on some type of selection criteria.

Figure 22:
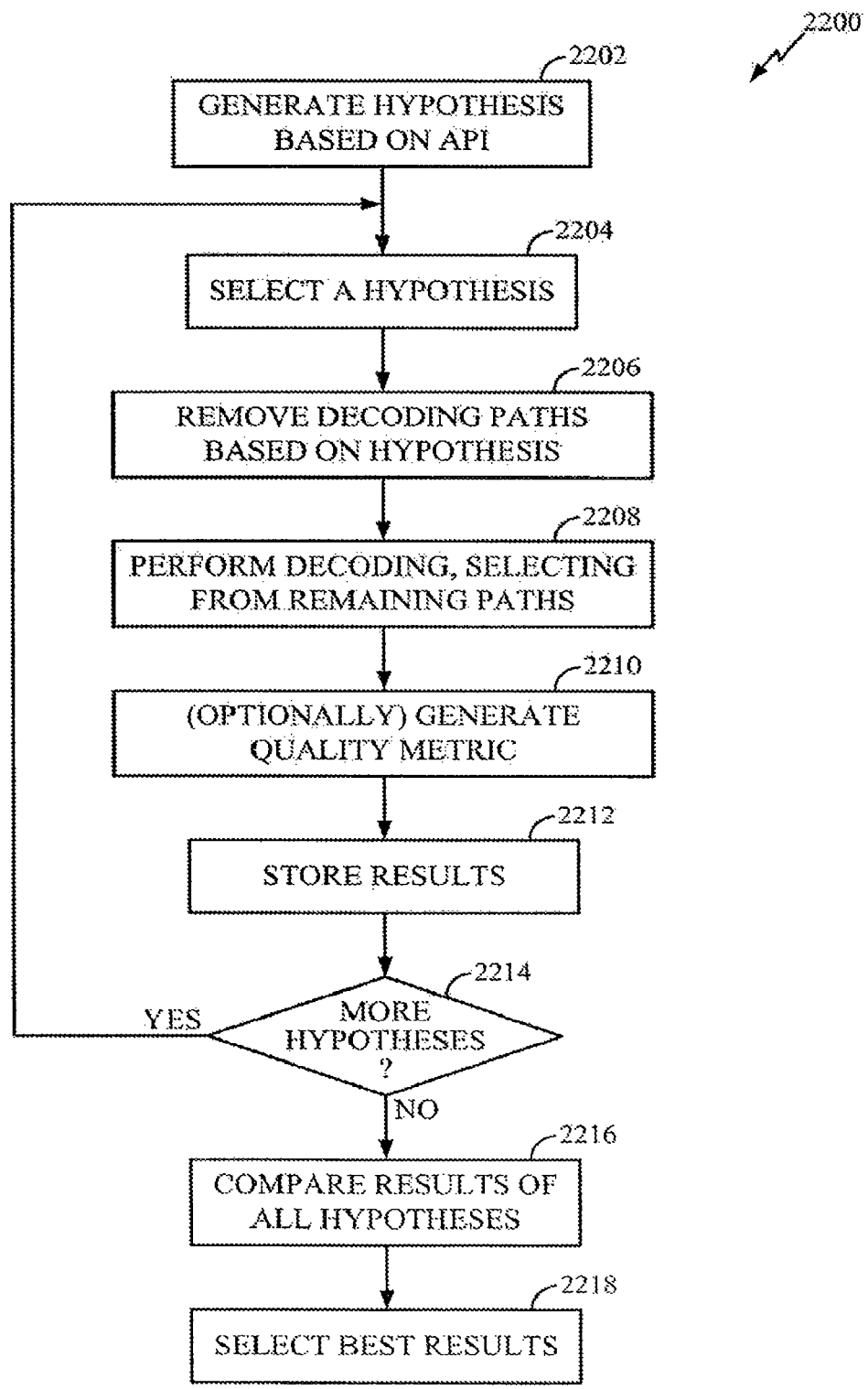
FIG. 22 illustrates example operations for evaluating multiple decoding hypotheses in a sequential manner.

FIG. 22 illustrates example operations 2200 for evaluating multiple hypotheses in a sequential manner. The operations 2200 may be described with reference to FIG. 23, which illustrates an example embodiment of the sequential decoder 2130 having a single API decoder 2300 for decoding a set of received bits RS multiple times sequentially, based on API bit values of different hypotheses.

The operations begin, at 2202, by generating a plurality of hypotheses based on a-priori information. At 2204, one of the hypotheses, with bit values API(c), is selected to be sent to the decoder 2130 for use in decoding the received bits.

The decoder performs API decoding, at steps 2206 and 2208, removing decoding paths based on the API bit values and selecting 2330 from remaining paths to generate a set of decoded bits $R_D$. At 2210, the decoder may generate a quality metric (QA) 2310 that may be used to select a best hypothesis, for example, in the event the decoded message does not include a CRC 2320. As described above, if the message does contain a CRC, a separate quality metric may or may not be generated. At 2212, the decoding results and quality score (if generated) are stored in memory 2340, for later evaluation.

If there are more hypotheses, as determined at 2214, operations 2204-2212 are repeated. Once the operations have been performed for each hypothesis, the results of the hypotheses are compared, at 2216, and the results obtained using the best hypothesis are selected, at 2218.

Figure 23:
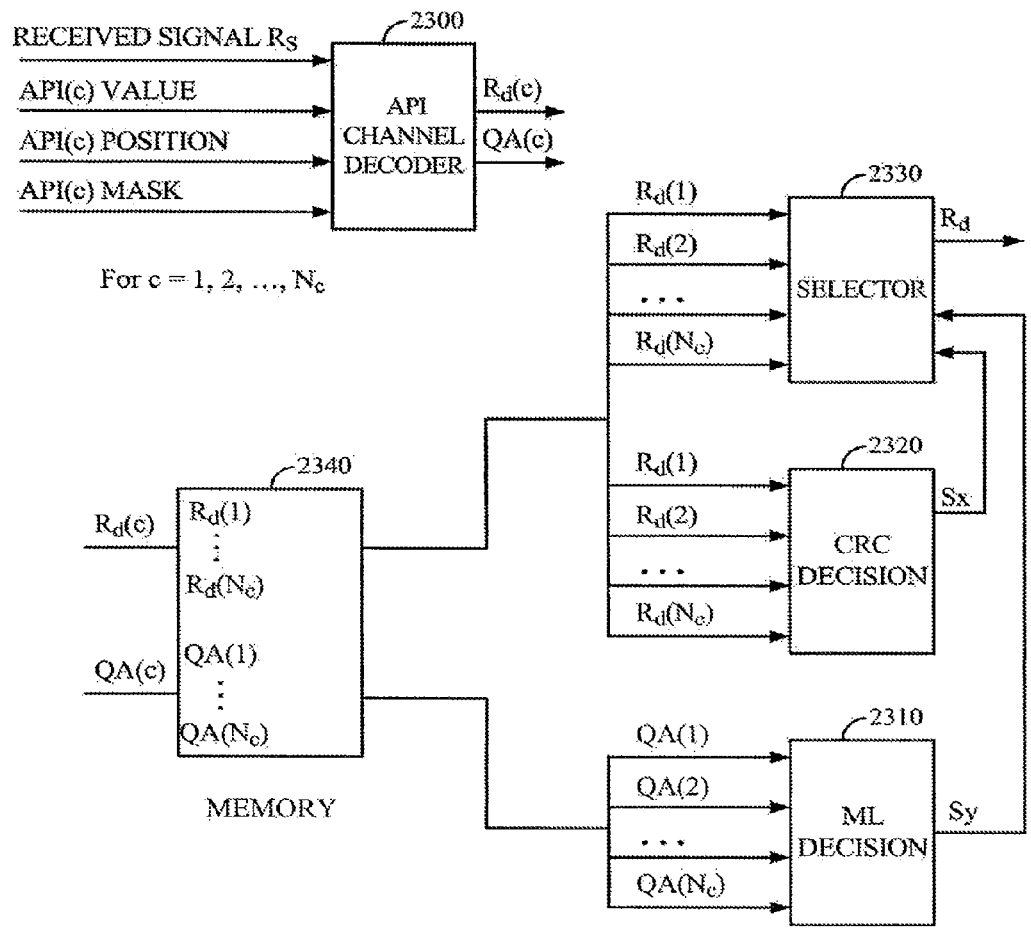
FIG. 23 illustrates an example decoder capable of evaluating multiple decoding hypotheses in a sequential manner.

As illustrated in FIG. 23, the decoding results $R_D(c)$ and quality metric QA(c), if generated, for each of the hypotheses may be retrieved from memory 2340 and evaluated to determine the best hypothesis. As illustrated, similar circuitry to that shown in FIG. 20 may be used to output an identification of a best hypothesis based on a CRC ($S_X$) and/or a quality metric ($S_Y$) to control selection logic to output the corresponding decoded results.

Figure 24:
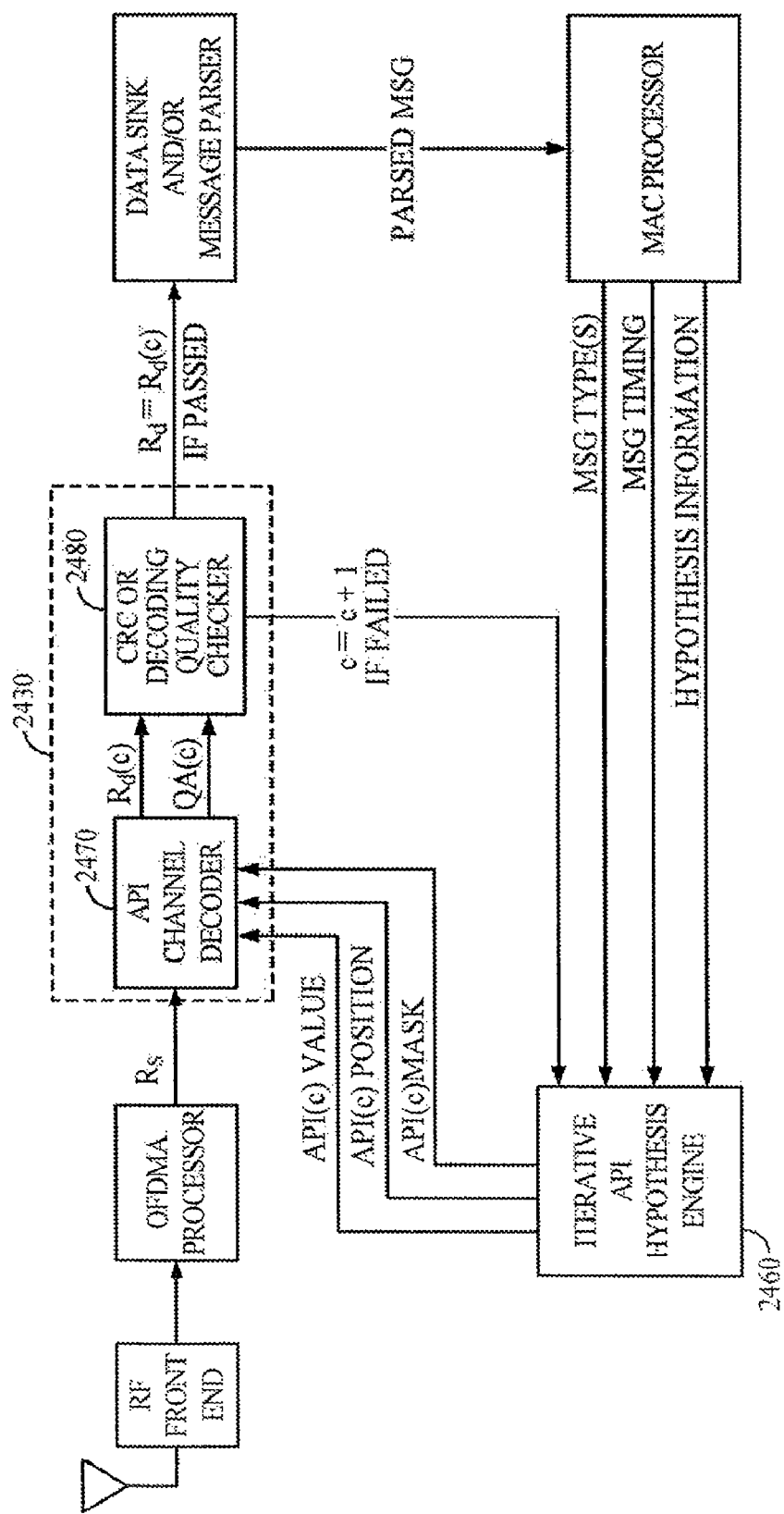
FIG. 24 illustrates an example receiver capable of evaluating multiple decoding hypotheses in an iterative manner.

FIG. 24 illustrates a receiver circuit that includes an iterative API decoder 2430 and a Hypothesis Engine 2460 that generates multiple hypotheses.

As with the Hypothesis Engine 2160 of FIG. 21, the Hypothesis Engine 2460 may generate $N_C$ different hypotheses, and output these hypotheses in a sequential manner to the decoder 2430. As with the decoder 2130 of FIG. 21, the decoder 2430 may utilize a single decoder 2470 to decode received bits Rs using the API bit values API(c) of the different hypotheses, in effect, decoding the received bits multiple times in serial by applying different hypotheses.

However, rather than evaluating each of possible hypothesis and comparing the output results, the decoder 2430 may compare the results of each hypothesis against threshold selection criteria. Once a hypothesis is evaluated with results that satisfy the selection criteria, the corresponding decoded data bits may be output without evaluating any remaining hypotheses.

Figure 25:
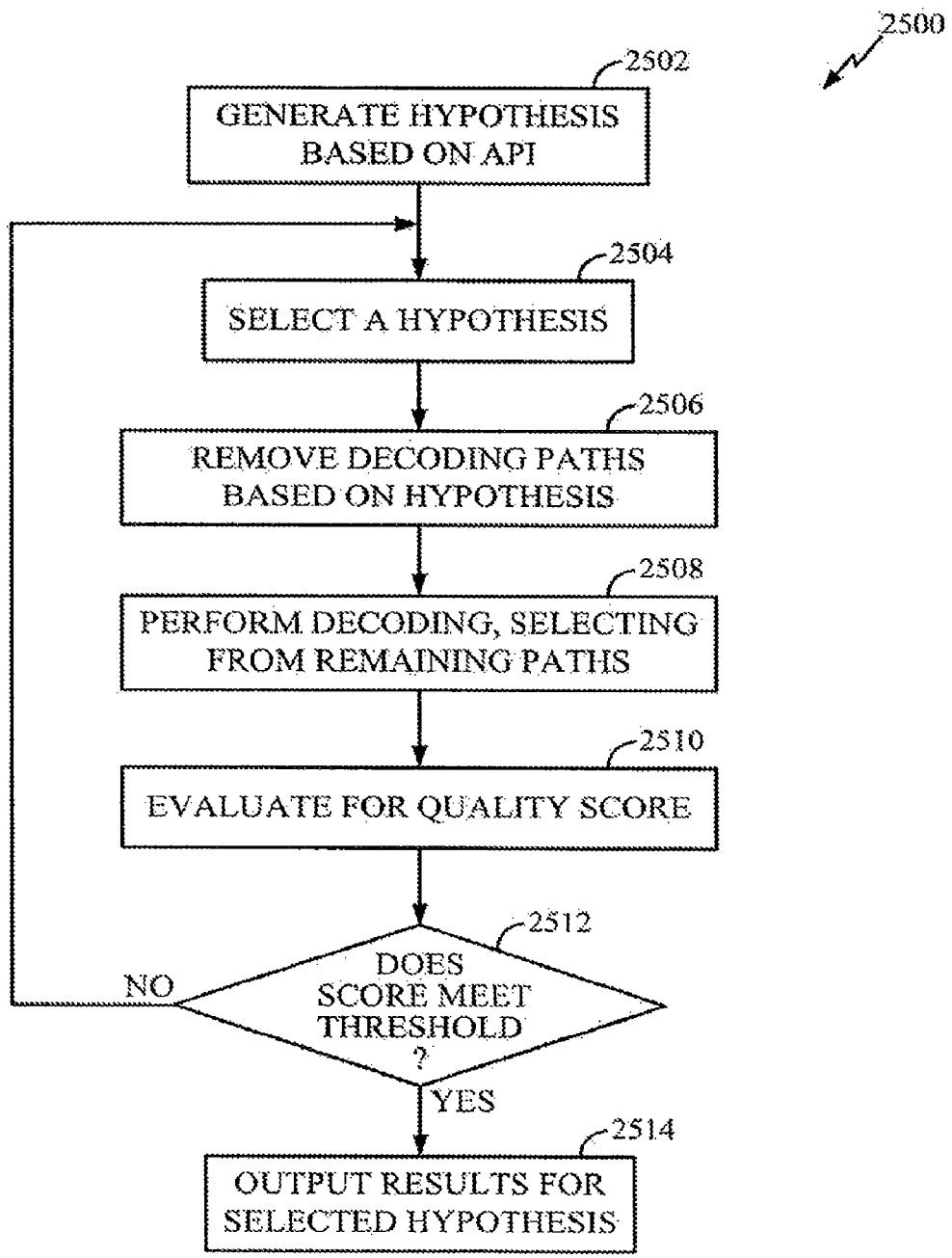
FIG. 25 illustrates example operations for evaluating multiple decoding hypotheses in an iterative manner.

FIG. 25 illustrates example operations 2500 for evaluating multiple hypotheses in an iterative manner. The operations 2500 may be performed, for example, by components shown in FIG. 24.

The operations begin, at 2502, by generating a plurality of hypotheses based on a-priori information. At 2504, one of the hypotheses, with bit values API(c), is selected to be sent to the decoder 2430 for use in decoding the received bits. The decoder performs API decoding, at steps 2506 and 2508, removing decoding paths based on the API bit values and selecting from remaining paths to generate a set of decoded bits $R_D$.

Rather than wait until all of the hypotheses are evaluated and comparing the results, as in FIG. 22, the results obtained for the selected hypothesis are evaluated (within the loop), at step 2512. As illustrated, the decoder 2430 may include logic 2480 to determine if a set of decoded bits satisfies the selection criteria. For example, logic 2480 may perform a CRC check and/or compare a quality metric to a predetermined threshold value.

If the selection criteria are not met (e.g., CRC check is not a match or the quality metric falls below the threshold), operations 2504-2512 may be repeated, to evaluate a different hypothesis. However, if the selection criteria are met, the results obtained using the current hypothesis is selected, at 2514.

The order in which different hypotheses are evaluated in this iterative approach may vary. For example, for certain embodiments more aggressive hypotheses (with more known/predicted bit values) may be evaluated before less aggressive hypotheses. For certain embodiments, less aggressive hypotheses may be evaluated before more aggressive hypotheses. For certain embodiments, some other type of criteria may be used to determine the order in which the hypotheses are selected for evaluation.

Those skilled in the art will recognize that the various techniques for evaluating multiple hypotheses may be varied or, in some cases, combined. For example, as previously described, parallel and sequential techniques may be combined to evaluate a plurality of hypotheses in parallel, in the event that there are more hypotheses than parallel decoders.

Exemplary Messages for Extracting API Information

As stated above, API decoders may employ a-priori information regarding the sequence, format, and/or content of various types of messages to determine and/or predict bit values in order to reduce bit error rates in decoding transmitted messages.

As an example, according to the IEEE 802.16e OFDMA Standard, the first data unit in a frame is a FCH (Frame Control Header), followed by a Normal DL-MAP or Compressed DL-MAP and UL-MAP. Frame control header (FCH) messages, Downlink MAP (DL-MAP) messages, and Uplink MAP (UL-MAP) messages are examples of messages that may be used to generate decoding hypotheses with known API bit values.

As described above, the FCH message typically contains MAP length and coding information, and various assumptions may be made about the content of such information, for example, based on a current standard, currently supported coding, and assumptions about map length. The DL-MAP and UL-MAP data typically provide data regarding resource allocation, such as sub-channels and sub-frames allocation and other control information for the downlink and uplink frames. Information about the format and content of these MAP messages may be used to generate API bit values for decoding these messages.

Figure 26:
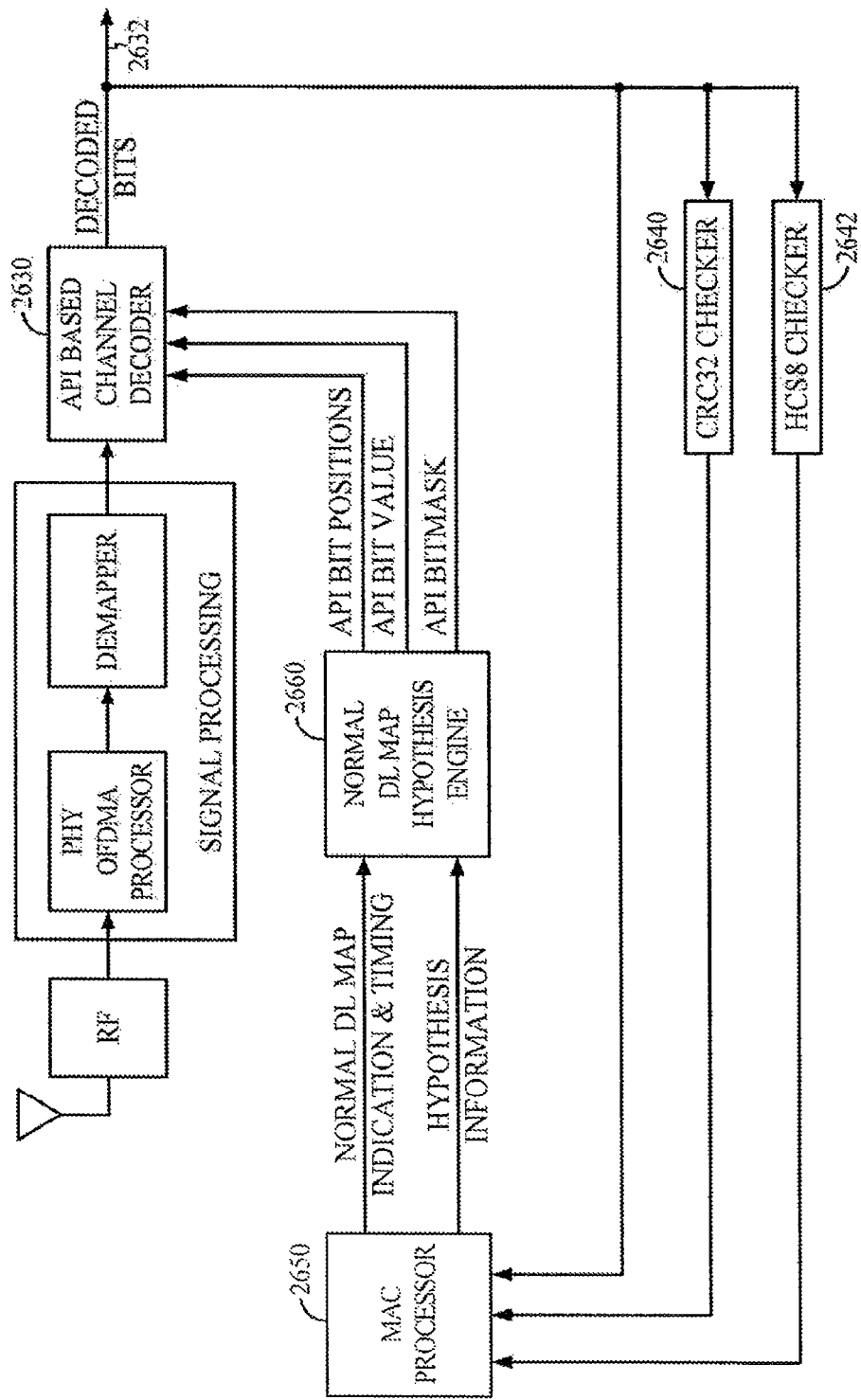
FIG. 26 illustrates an example receiver capable of API decoding with a hypothesis based on a DL-MAP message.

FIG. 26 illustrates a receiver circuit capable of decoding a DL-MAP message based on a-priori information. As illustrated, a MAC Processor 2650 may provide DL-MAP timing and message information to a Hypothesis Engine 2660. The Hypothesis Engine 2660 may generate a set of API bit values, based on the DL-MAP information, to control an API decoder 2630. Depending on the embodiment, the MAC Processor may provide continual timing and DL-MAP information (e.g., each frame) or may only update this information less frequently as it changes.

The MAC Processor 2650 may analyze previously decoded bits, and check the results from CRC check logic 2640 and HCS8 (Header Check Sequence) check logic 2642 to determine if a correct DL-MAP message is present and provide DL-MAP indication information and timing as well as other a-priori information to a Hypothesis Engine 2660.

The HCS8 logic may perform a check of an 8-bit CRC for a MAC header (e.g., as defined under the IEEE 802.16 standard) provided with a Normal DL-MAP message. This check provides an indication of if, at least, the MAC header was decoded properly. As will be described in greater detail below, in the event a full CRC check fails (for the entire Normal DL-MAP message), a successful HCS8 check may allow information in the successfully decoded MAC header to be used to generate API bit values, which may aid in decoding the remainder of the message.

Figure 27:
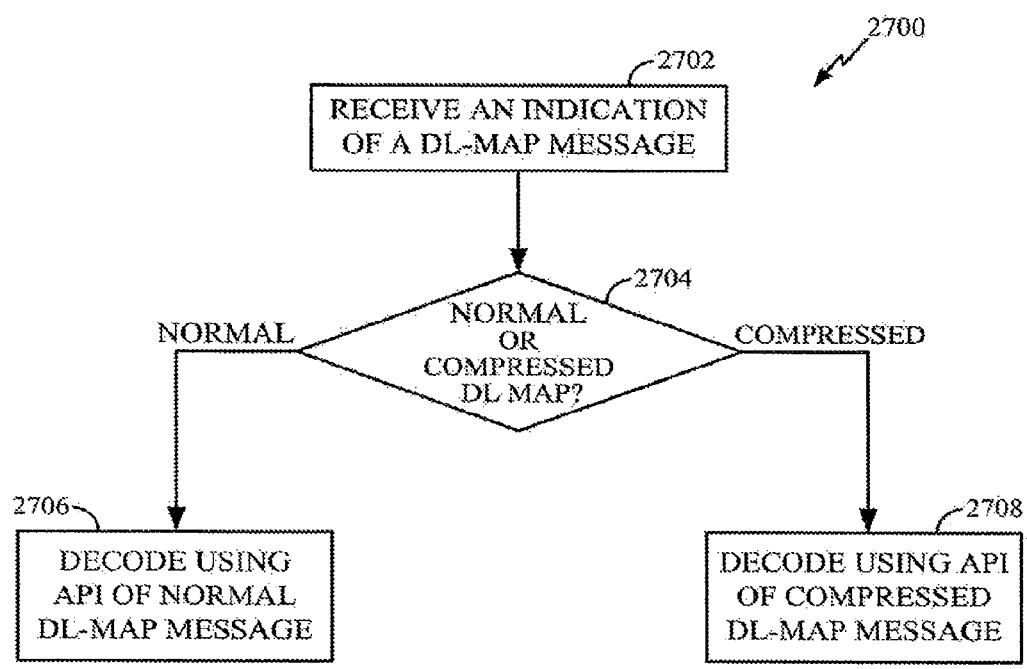
FIG. 27 illustrates example operations for API decoding with a hypothesis based on a DL-MAP message.

Because of different format and content, Normal DL-MAP messages and Compressed DL-MAP messages may be decoded differently. For certain embodiments, a receiver circuit may be able to generate a different set of API bit values in order to decode the appropriate message. FIG. 27 illustrates example operations for decoding Normal and Compressed DL-MAP messages.

At 2702, an indication of a DL-MAP message is received. For example, the MAC Processor may provide this indication based on known timing of a message sequence that a DL-MAP message is the next in sequence. A determination is made, at step 2704, whether the DL-MAP message is Normal or Compressed. If the DL-MAP message is Normal, the message is decoded using API bit values generated for a Normal DL-MAP message at 2706. If the DL-MAP message is Compressed, the DL-MAP message is decoded using API bit values generated for a Compressed DL-MAP at 2708.

While these are shown as separate steps that are mutually exclusive in these example operations, for certain embodiments, parallel decoders may be provided for decoding Normal and Compressed DL-MAP messages, allowing decoding to begin even before the DL-MAP message type is known. After decoding, only the decoding results for the correctly decoded type will be used and the other discarded.

Figure 28:
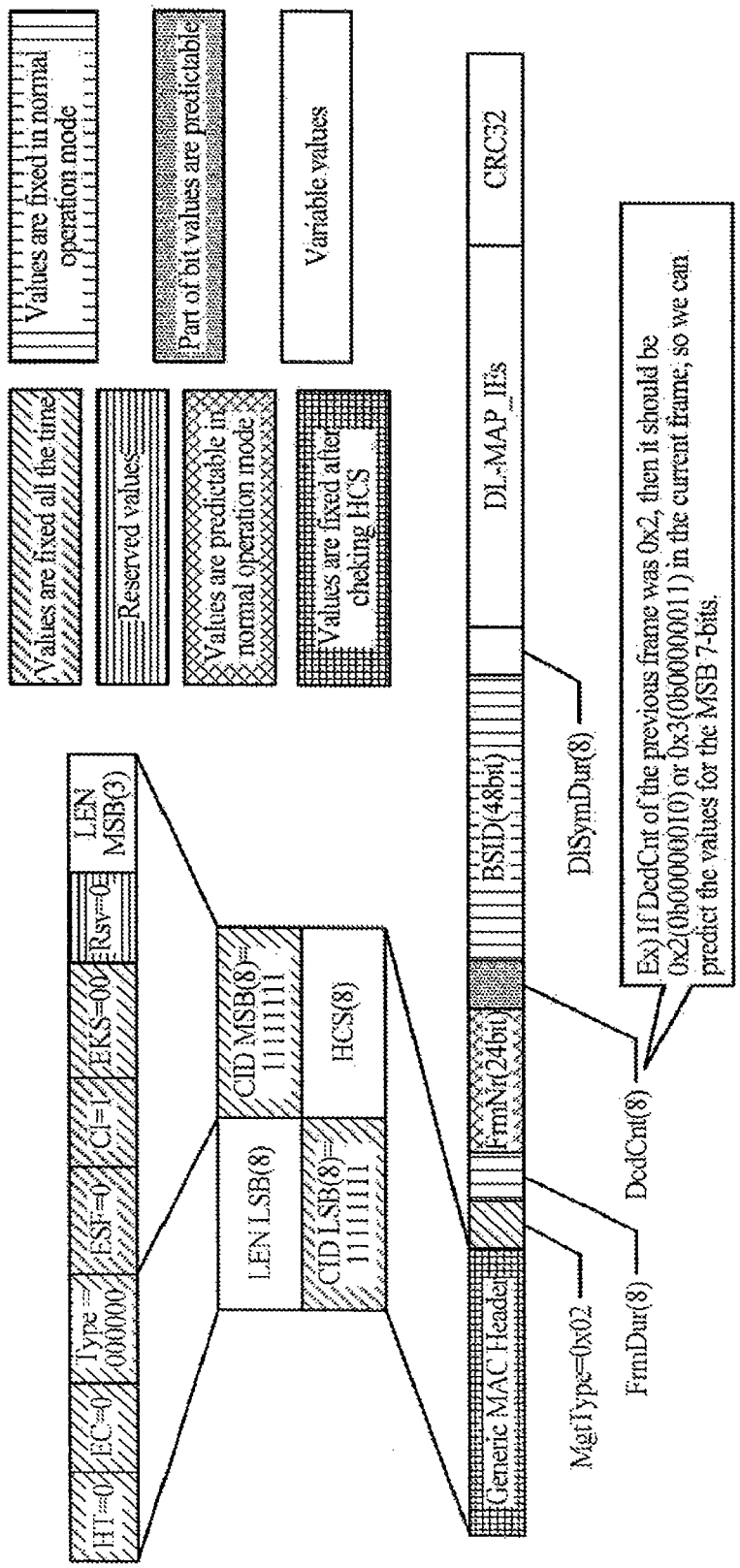
FIG. 28 illustrates an example Normal DL-MAP message format.

One of the main differences between Normal and Compressed DL-MAP messages is the MAC header provided in the Normal DL-MAP message. FIG. 28 illustrates a full Normal DL-MAP message format. A first portion of the message, from the beginning of the MAC header to the DlSymDur field, has a fixed length. This fixed length portion is followed by multiple variable size field DL-MAP IE fields and, finally, a CRC32 field.

Thus, if a message can be identified as being a Normal DL-MAP message, it is possible to generate several API bit values. For example, many fields of the MAC Header are fixed to certain values all the time. These fields can be used to generate hypotheses for the API decoder based on known bit values. In FIG. 28, fields that have fixed values are indicated with a first cross-hatching. Some reserved fields, marked with a second cross-hatching, may also be treated as known bit values, provided a standard mandating the values for those fields do not change.

There are also several fields which are also fixed all the time during communication, but these values may not be known, for example, until a mobile station decides to associate with a base station. These fields, marked with a third cross-hatching, can be treated as fixed fields for API decoding after synchronizing with a base station.

Additional bit values may also be determined based on a present value and possible future values. For example, the frame number field (FrmNr) increases monotonically by one each frame, such that the bit values may be predictable across frames.

While the Downlink Channel Descriptor (DCD) count field (DcdCnt) does not change each frame, it may incremented by one on occasion to indicate a change in configuration of a DCD message. Therefore, while it may not be possible to predict all of the bits, if the current value is known, it is possible to predict bit values based on the limited number of DCDCnt bits that might change if the value is incremented by one. As a simple example, of the value is 0x2 (b'00000010') in a previous frame, the value should be 0x2 or 0x3 (b'00000011) in the next frame, meaning the bit values of the 7 MSBs is predictable (API Bit values=b'0000001X').

Figure 29:
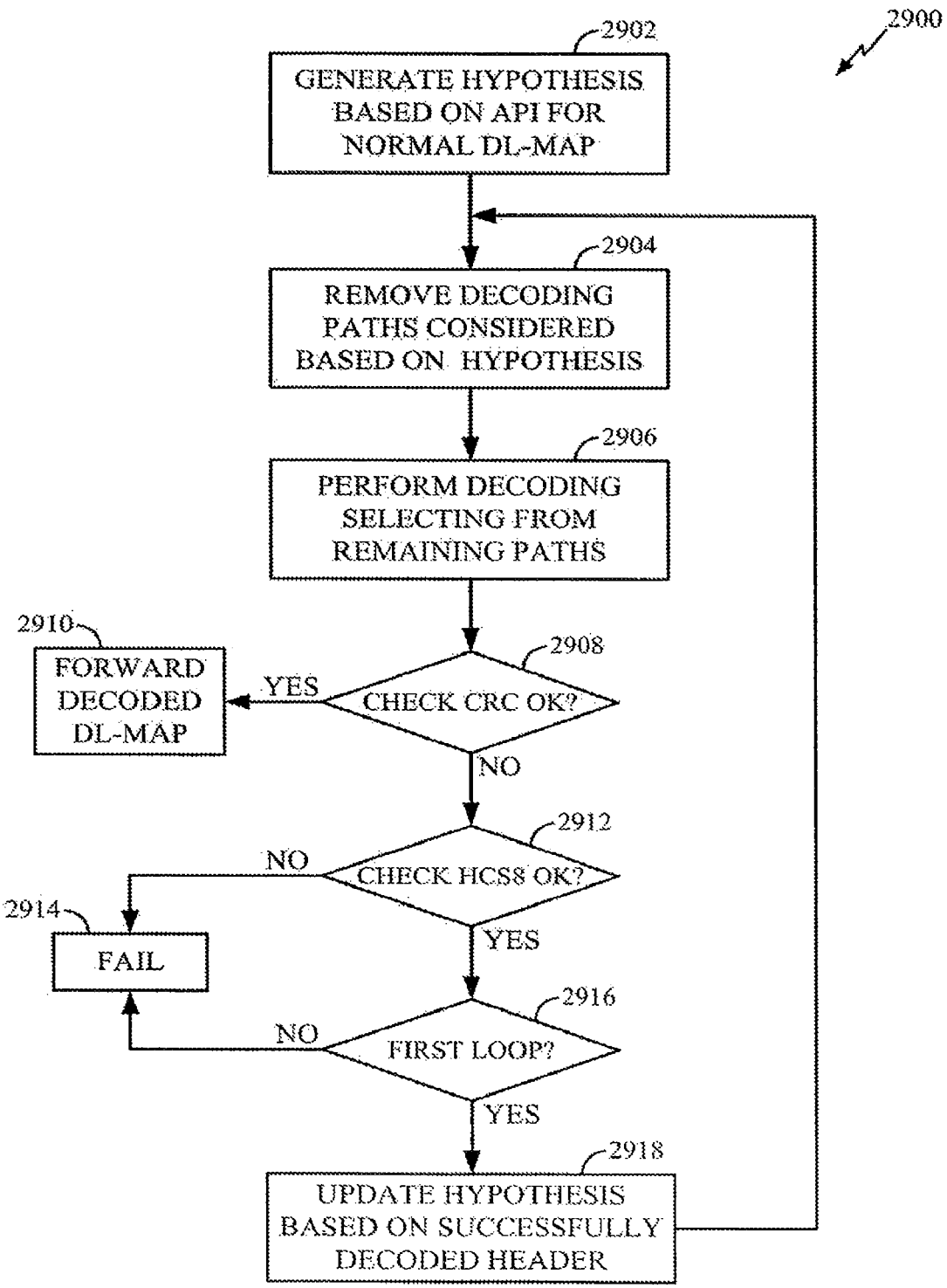
FIG. 29 illustrates example operations for API decoding of a Normal DL-MAP message.

FIG. 29 is a flow diagram of example operations 2900 for API decoding of a Normal DL-MAP message, for example, that may be performed by the receiver of FIG. 26. The example operations 2900 begin at 2902, by generating a hypothesis based on API regarding a Normal DL-MAP message. The operations may begin at a frame boundary or after detecting valid frame preamble. For example, the MAC Processor may update and provide Normal DL-MAP hypothesis information to the Normal DL-MAP Hypothesis Engine. For certain embodiments, the Normal DL-MAP Hypothesis may keep the latest information so that MAC Processor does not need to update the information if it has not been changed. Updating and providing Normal DL-MAP hypothesis information may be done at the end of the flow for the next frame.

API decoding is performed, at 2904 and 2906, by removing decoding paths from consideration that are inconsistent with the API bit values and selecting from the remaining paths to generate a set of decoded bits for the message. For example, the API decoder may start decoding the DL-MAP decoding at the time offset of DL-MAP from the frame boundary which is predefined in the standard.

At 2908, a CRC check is performed (on the full message) to determine if the message decoded successfully. For example, output of the API decoder goes into the CRC32 Checker which compares received CRC value and calculated CRC value to verify the DL-MAP message. If the CRC check is successful, it is assumed the messaged decoded correctly, and the DL-MAP is forwarded on, at 2910.

In the event the CRC check for the full message is unsuccessful, however, the MAC header check code (HCS8) may be checked at 2912 to see if, at least the MAC header decoded successfully. If the HCS8 check is successful and the current decoding loop is the "first pass" as determined at 2916, hypothesis information may be updated at 2918, for example, using the entire successfully decoded MAC Header fields, in addition to the other fixed/predicted fields from the remaining portion of the Normal DL-MAP message.

Using this updated hypothesis with, potentially, substantially more known bit values, a second attempt may be made to decode the message. The additional bits may result in a successful CRC check at 2908. Otherwise, the decoding is determined to have failed, at 2914.

For certain embodiments, similar API decoding operations may be performed based on fixed, reserved, and predicted bit values for a Compressed DL-MAP message.

Figure 30:
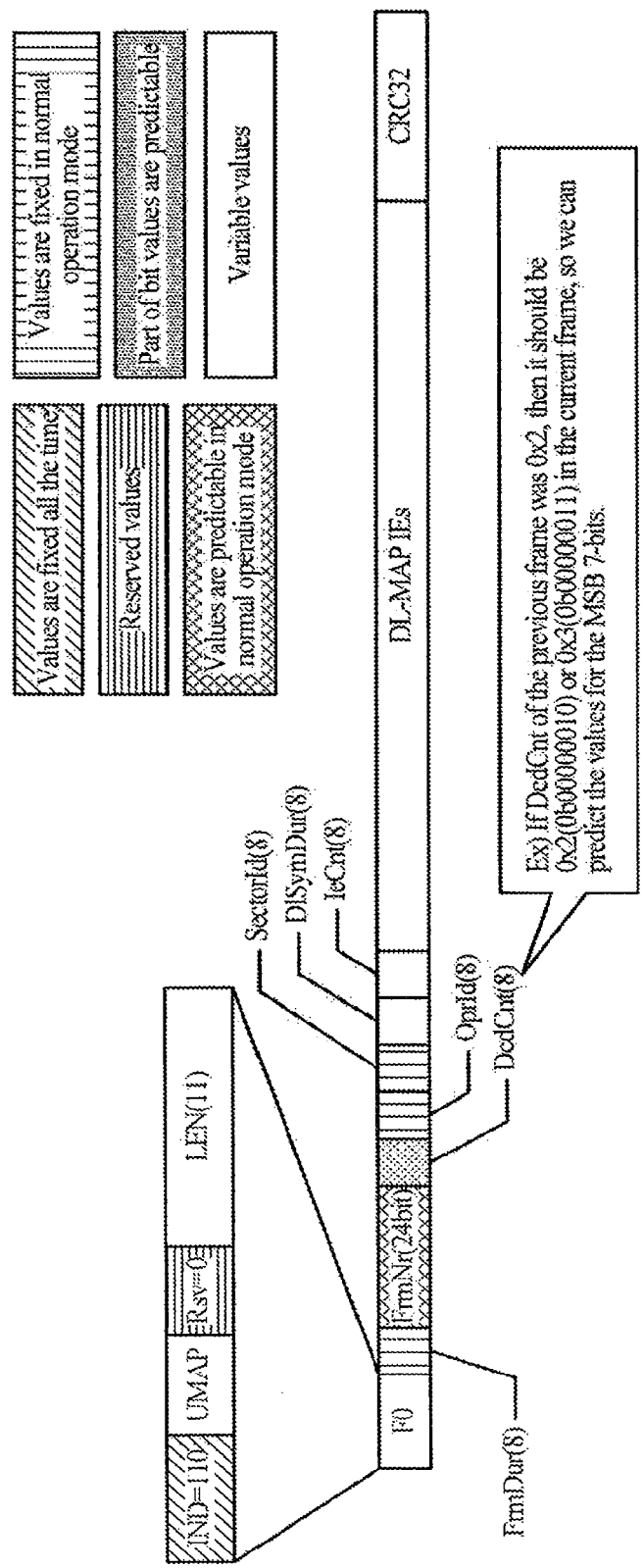
FIG. 30 illustrates an example Compressed DL-MAP message format.

FIG. 30 illustrates the Compressed DL-MAP message format. A first portion of the message, from a beginning of the message to the IeCnt field, has a fixed length, followed by multiple variable-sized DL-MAP IEs and, finally, a CRC32 field. After identifying the message as a Compressed DL-MAP message (e.g., by the MAC Processor), the first 3 bits of the message that identify the type of message as a Compressed MAP indicator are known and will be fixed (b'110'), as indicated by a first cross-hatching.

A reserved field, indicated with a second cross-hatching, can also be considered fixed and used for API decoding, provided the standard does not change that field for some purposes. As with the Normal DL-MAP message, there are also several fields which are also fixed all the time during communication, but these values may not be known, for example, until a mobile station decides to associate with a base station. These fields, marked with a third cross-hatching, can be treated as fixed fields for API decoding after synchronizing with a base station.

Additional bit values may also be determined based on a present value and possible future values of other fields that are common with the Normal DL-MAP. These fields include the frame number field (FrmNr) and Downlink Channel Descriptor (DCD) count field (DcdCnt) as described above.

For certain embodiments, decoding logic may be provided to select between Normal and Compressed DL-MAP message types. While it may be known, based on a message sequence, that a DL-MAP is coming, it may not be known whether it is a Normal or Compressed DL-MAP message.

Figure 31:
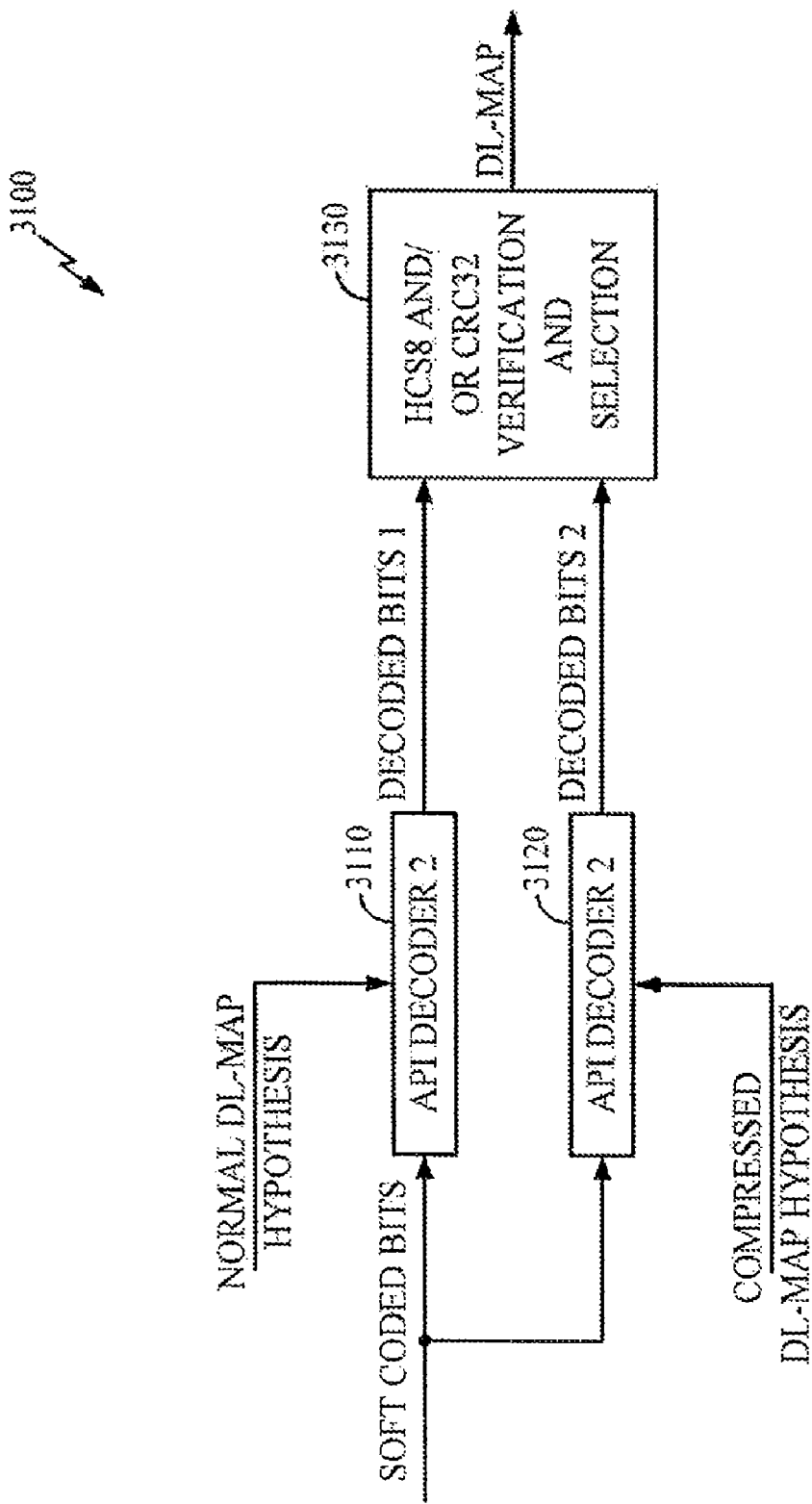
FIG. 31 illustrates an example decoder capable of evaluating Normal DL-MAP and Compressed DL-MAP hypotheses in parallel.
Figure 32:
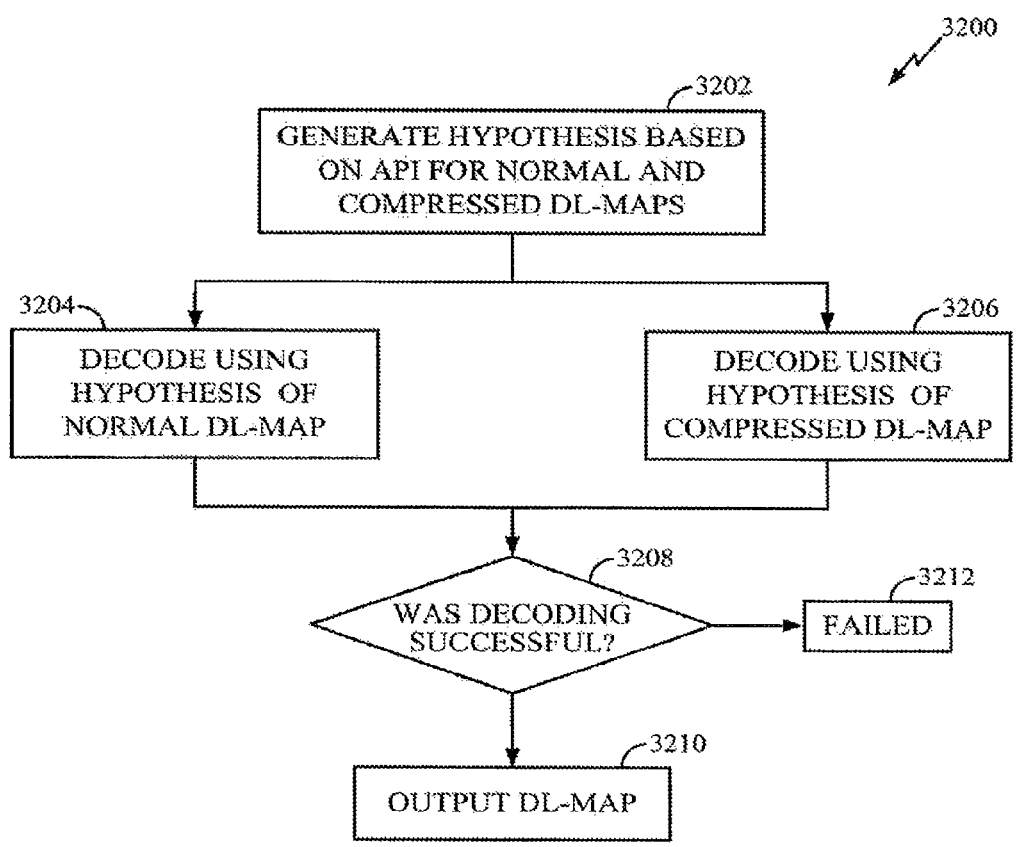
FIG. 32 illustrates example operations for evaluating Normal DL-MAP and Compressed DL-MAP hypotheses in parallel.

FIG. 31 illustrates decoding logic 3100 that includes parallel API decoders for decoding Normal and Compressed DL-MAP messages in parallel. FIG. 32 illustrates example operations 3200 for processing Normal and Compressed DL-MAP messages in parallel. The operations 3200 may be performed by components shown in FIG. 32.

The operations 3200 begin, at 3202, by generating hypotheses based on a-priori information for both Normal and Compressed DL-MAPs. At 3204 and 3206, API decoding is performed in parallel using the Normal and Compressed DL-MAP hypotheses. As illustrated, decoder 3110 decodes coded bits based on Normal DL-MAP API bit values, while decoder 3120 decodes the same coded bits based on Compressed DL-MAP API bit values.

At 3208, a determination is made as to whether the DL-MAP message was successfully decoded using either the Normal or Compressed DL-MAP hypotheses. If not, the decoding fails, at step 3212. Otherwise, the DL-MAP is output, at 3210, regardless of whether the DL-MAP message was Normal or Compressed.

To determine whether decoding was successful and help select between the decoders, DL-MAP selection logic 3130 may be provided to verify the decoded data by performing a CRC32 and/or HCS8 check. If the CRC check is successful for output from decoder 3120, the message is a Compressed DL-MAP message. If the CRC check is successful for output from decoder 3110, the message is a Normal DL-MAP message. As described above, a successful partial decoding of the MAC header of a Normal DL-MAP, as indicated by a successful HCS8 check, may be used to perform another iteration of decoding for a Normal DL-MAP, in the event the CRC check fails.

As an alternative to the parallel approach described above, a DL-MAP may also be decoded using a sequential approach. For example, a single API decoder may be utilized to try Normal and Compressed DL-MAP hypotheses in a sequential manner. As an example, a hypothesis for a Normal DL-MAP may be attempted first and, if decoding fails, a hypothesis for a Compressed DL-MAP may be used. Using a single decoder may consume less power than a multiple decoder embodiment described above.

For certain embodiments, to minimize a number of iterations, a history of previous DL-MAP types may be used to predict the DL-MAP type of the current frame. In other words, if the last DL-MAP message type was Compressed, the API bit values corresponding to Compressed DL-MAP type may be used for decoding. If the Compressed DL-MAP API decoding fails, the API bit values corresponding to the Normal DL-MAP type may be used in a subsequent decoding iteration.

A-priori information regarding Uplink MAP (UL-MAP) message format and content may also be used to generate API bit values and assist in decoding. According to the IEEE 802.16e OFDMA Standards, it is specified that a UL-MAP message is the first MPDU in the burst which is directed by the first data traffic DL-MAP Information Element (IE). If both Compressed UL-MAP and Sub-DL-UL-MAP do not exist in the frame, the Mobile Station can typically assume that the first MPDU of the first data burst will be the UL-MAP message if some conditions are satisfied after parsing DL-MAPs. Using this information, the Mobile Station knows which type of message shall be output by the decoder at a certain point and can use the 'known values' of the message as 'a-priori information' to improve decoding performance based on the API decoding scheme.

Figure 33:
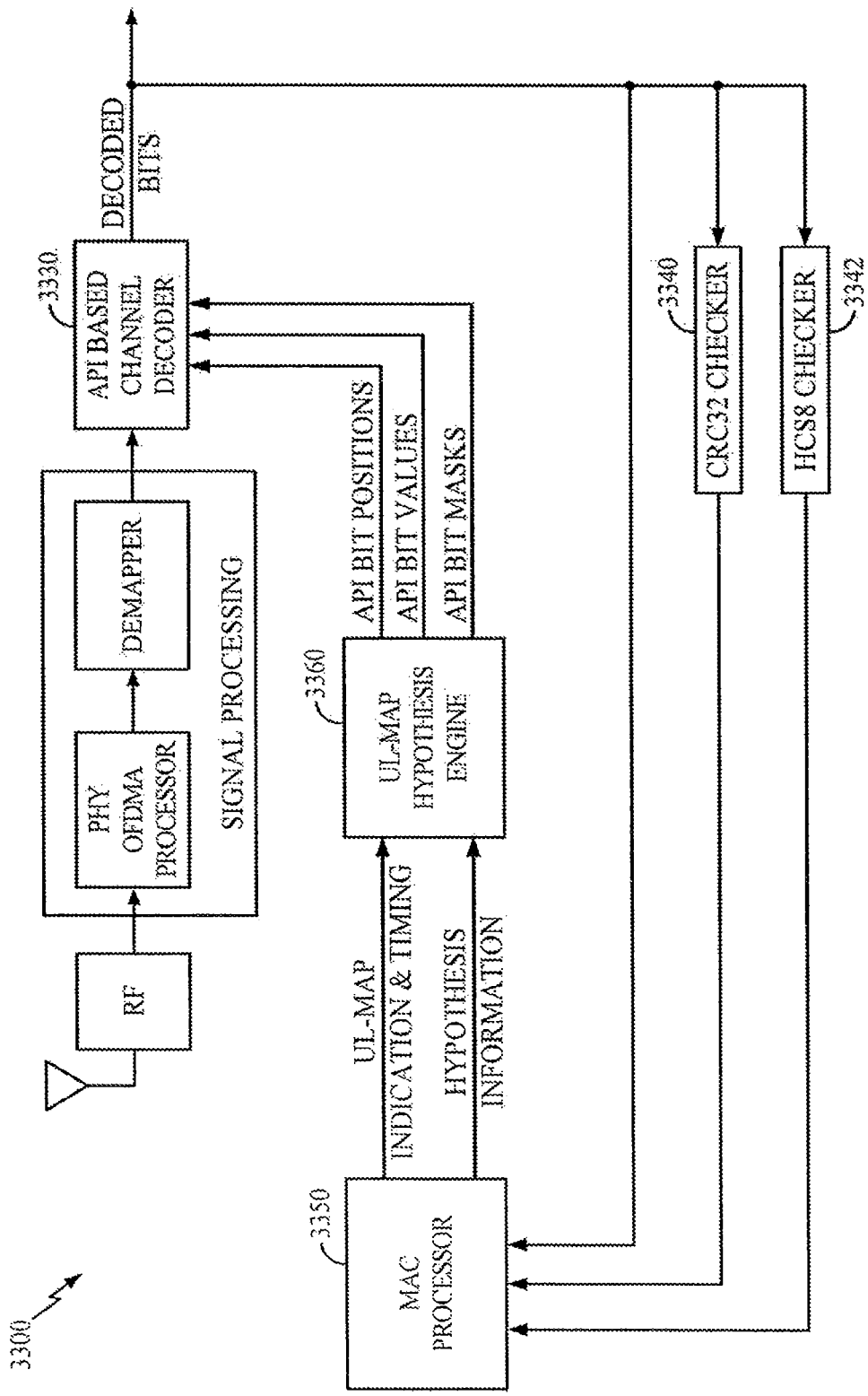
FIG. 33 illustrates an example receiver capable of API decoding with a hypothesis based on a UL-MAP message.

FIG. 33 illustrates a receiver circuit capable of decoding a UL-MAP message based on a-priori information. Due to similarities in format between DL-MAP and UL-MAP messages, the receiver circuit may operate in a similar manner to the receiver circuit of FIG. 26 capable of decoding DL-MAP messages based a-priori information.

As illustrated, a MAC Processor 3350 may provide UL-MAP timing and message information to a Hypothesis Engine 3360. The Hypothesis Engine 3360 may generate a set of API bit values, based on the UL-MAP information, to control an API decoder 3330. Depending on the embodiment, the processor may provide continual timing and UL-MAP information (e.g., each frame) or may only update this information less frequently as it changes. The processor 3350 may analyze previously decoded bits, and check the results from CRC check logic 3340 and HCS8 check logic 3342 to determine if a correct UL-MAP message is present and provide UL-MAP indication information and timing as well as other a-priori information to a Hypothesis Engine 3360.

Figure 34:
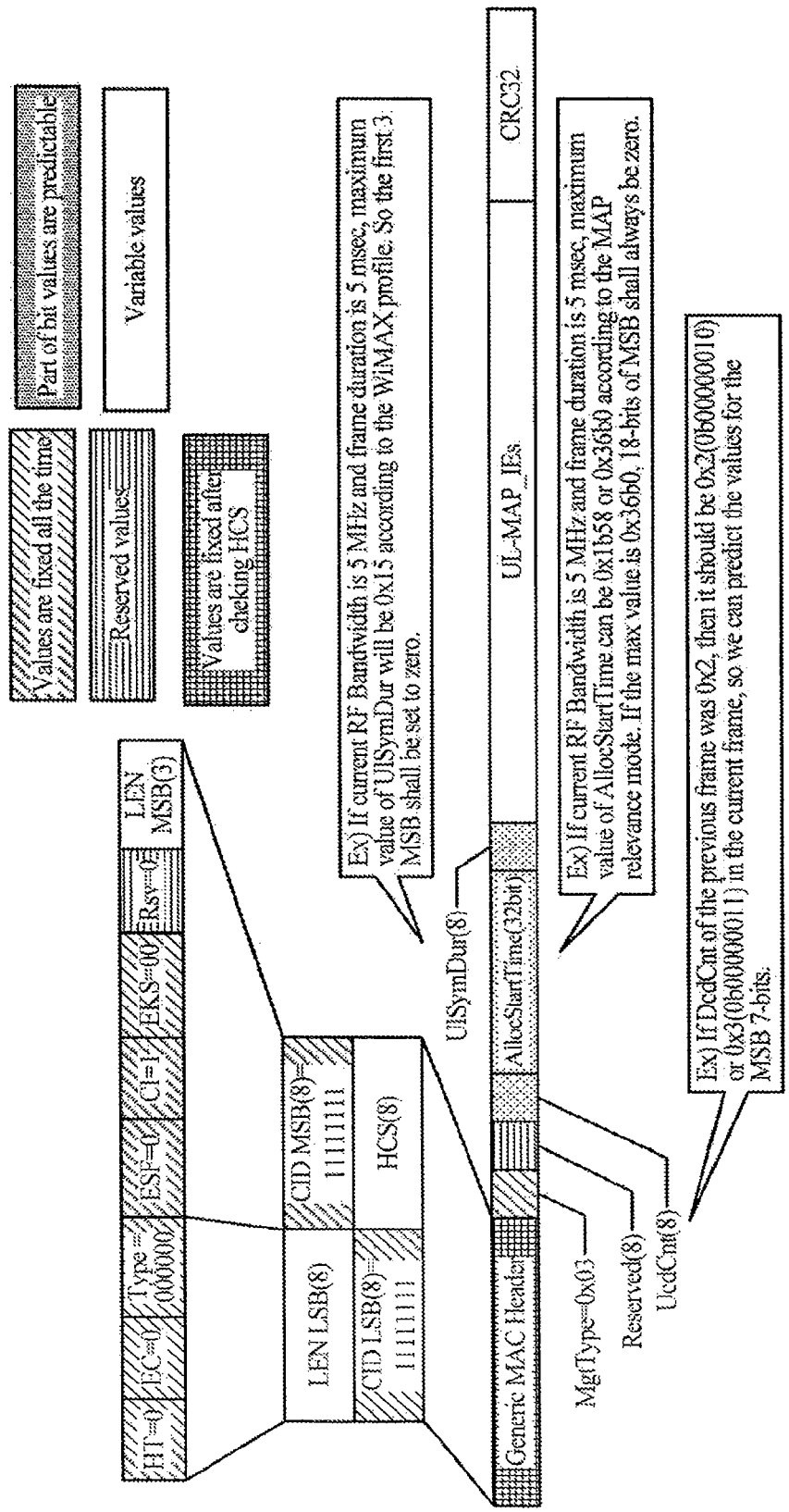
FIG. 34 illustrates an example UL-MAP message format.

FIG. 34 illustrates a UL-MAP message format. A first portion of the message, from the beginning of the MAC header to the UlSymDur field, has a fixed length. This fixed length portion is followed by multiple variable size field UL-MAP IE fields and, finally, a CRC32 field.

Once it is determined the message is a UL-MAP message, many fields of MAC Header part will remain fixed values. This known information about these fields can be used to generate API bit values for the API decoder. In the Figure, fields have fixed values are indicated by first cross-hatching. Some reserved fields, indicated by a second cross-hatching, can also be used by the API decoder, provided the standard does not change the bit values of the fields for some purpose.

There are also various fields which have some values that can be predicted based on current operating parameters. As an example, an Uplink Channel Descriptor (DCD) count Ucd-Cnt field will not be changed in most cases, but may be increased by one at some point. Therefore, in most cases, a number of MSBs will not change.

As another example, the maximum value of certain fields may be determined once a Mobile Station has associated with a specific Base Station and obtained all network parameters that affect those fields are known. As an example, once RF Bandwidth, Frame Duration and UL-MAP relevance policy have been obtained, the maximum values for an Allocated Start Time field (AllocStartTime) and/or an Uplink Symbol Duration field (UlSymDur) can be calculated.

To illustrate this, if current RF Bandwidth is 5 MHz and frame duration is 5 msec, maximum value of AllocStartTime can be 0x1B58 or 0x36B0 according to the MAP relevance mode. If the max value is 0x36B0, 18 MSBs will be set to zero. As another illustration, if current RF Bandwidth is 5 MHz and frame duration is 5 msec, maximum value of UlSymDur will be 0x15 according to the WiMAX profile. Thus, the first 3 MSBs (bits 7-5) will be set to zero.

Figure 35:
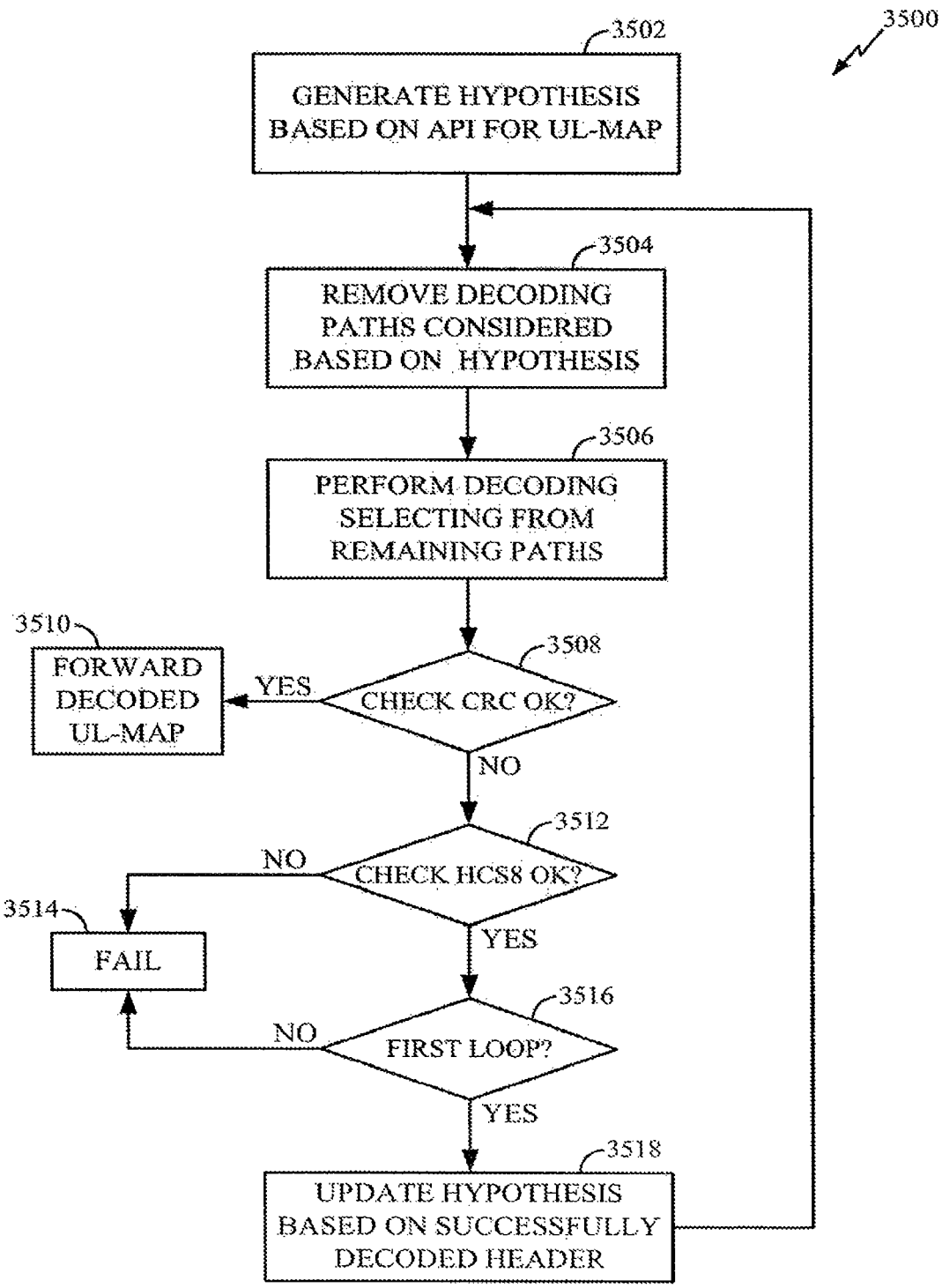
FIG. 35 illustrates example operations for API decoding of a UL-MAP message.

FIG. 35 illustrates example operations 3500 for decoding a UL-MAP message. The operations 3500 may begin, for example, after decoding a DL-MAP which follows FCH. As shown in FIG. 33, MAC Processor may update and provide UL-MAP hypothesis to the UL-MAP for these operations.

The operations 3500 begin, at 3502 by generating one or more hypotheses based on a-priori information for a UL-MAP. Depending on the embodiment, the UL-MAP Hypothesis Engine may keep the latest information so that MAC Processor does not need to update the information if it has not been changed. Updating and providing UL-MAP hypothesis may be done at the end of the flow for the next frame.

At 3504 and 3506, the API decoder may begin decoding using the UL-MAP API, removing decoding paths that are inconsistent with the API bit values and selection from remaining paths. The API decoder may begin decoding, for example, at the time offset of UL-MAP which is described in the corresponding DL-MAP IE which is in the DL-MAP message.

At 3508, a CRC check is performed on the decoded message. As illustrated in FIG. 33, the decoded bits output from the API decoder may be output to the CRC32 Check logic which compares received CRC value and calculated CRC value to verify the UL-MAP message. If the CRCs match, the successfully decoded UL-MAP is forwarded on, at 3510.

In a similar manner to that described above with reference to decoding a Normal DL-MAP, if the CRC for the entire message fails to verify, but the HCS8 for the MAC header matches at 3512, another iteration 3514 of decoding may be performed with an updated hypothesis generated at 3518. For example, the entire decoded MAC Header may be used as known values, in addition to other fixed/predicted bit values in the remaining portion of the UL-MAP message. If the decoding fails even after this second iteration, the decoding may be considered a failure, at 3514.

The examples described above, with reference to UL-MAP and DL-MAP message decoding, have primarily involved messages that are conventionally transmitted from a base station to a mobile station. Similar type API decoding operations may also take place at a base station, when decoding messages transmitted from a mobile station (or other type transmitter).

For example, API decoding may be applied to Ranging Request (RNG-REQ) and Bandwidth Request (BW-REQ) messages in accordance with WiMAX. API decoding operations using bit values generated based on a-priori information about RNG-REQ and BW-REQ messages may be utilized to increase RNG-REQ and BW-REQ message decoding performance in a Base Station.

According to the IEEE 802.16e Standard, a mobile station shall send CDMA codes to the Base Station to request resource allocation in the Uplink so that the mobile station can send RNG-REQ and/or BW-REQ messages. The base station may allocate some amount of resources in the Uplink using CDMA_Allocation_IE which is included in UL-MAP.

The base station knows what type of message will be delivered to the allocated region by the CDMA_Allocation_IE before it actually receives the message. This message will be a RNG-REQ message or BW-REQ message. Based on this information, the base station may perform API decoding using hypotheses with bit values generated based on a-priori information regarding RNG-REQ and BW-REQ messages.

Figure 36:
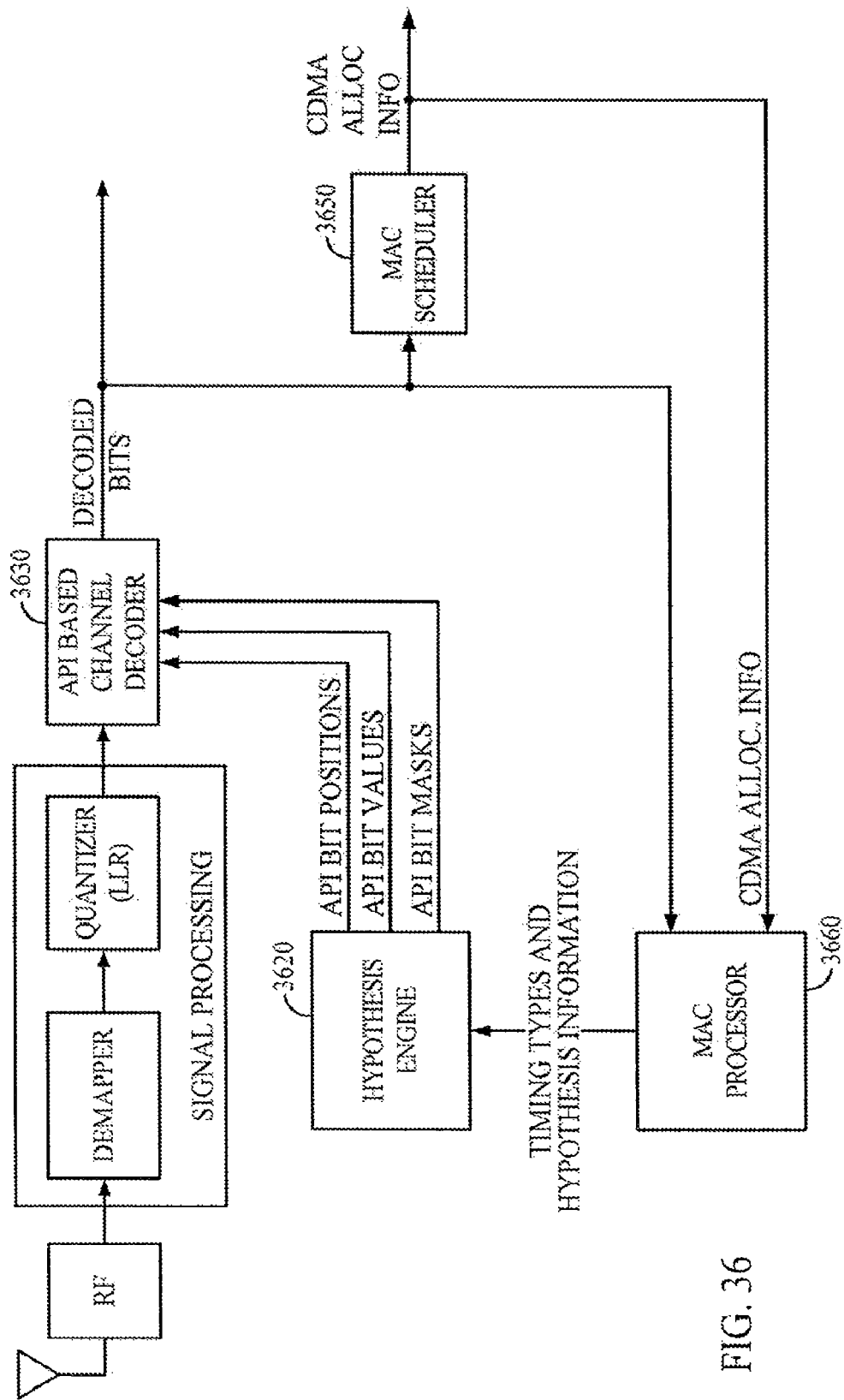
FIG. 36 illustrates an example receiver capable of API decoding at a base station with hypotheses regarding BW-REQ and RNG-REQ messages.

FIG. 36 illustrates a receiver circuit capable of API decoding based on a-priori information regarding RNG-REQ and BW-REQ messages. As illustrated, a MAC Scheduler 3650 may provide information to a MAC Processor 3630, CDMA_Allocation information (e.g., including timing, region and expected message type). The processor 3630 will forward related timing and hypothesis information on to the Hypothesis Engine 3620 which can extract known bit values and generate hypothesis information for decoding a RNG-REQ and/or BW-REQ message. RNG-REQ and BW-REQ hypotheses may be evaluated in a parallel or sequential manner, for example, as described above with reference to Normal and Compressed DL-MAP hypotheses.

Figure 37:
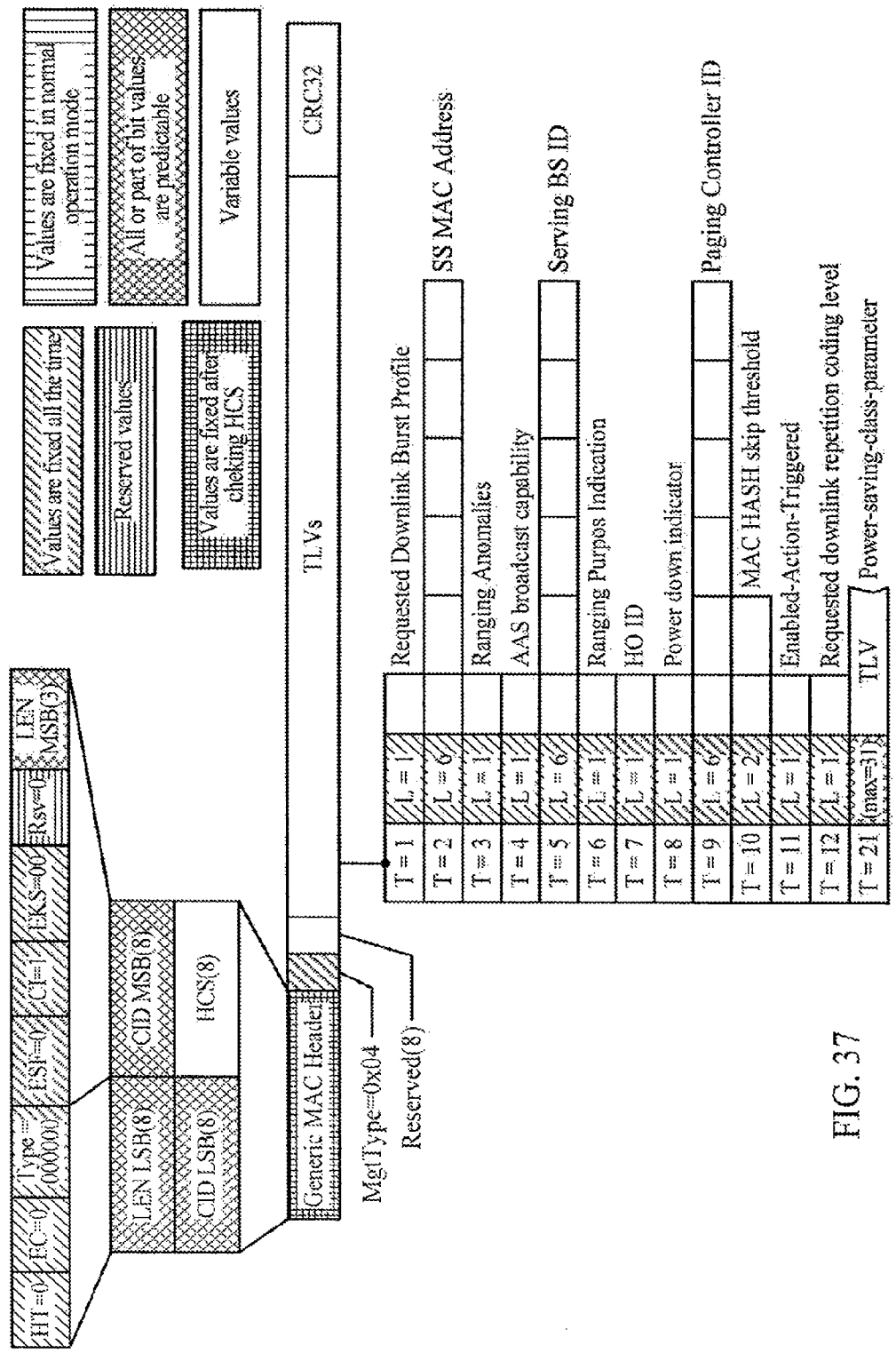
FIG. 37 illustrates an example RNG-REQ message format.
Figure 38:
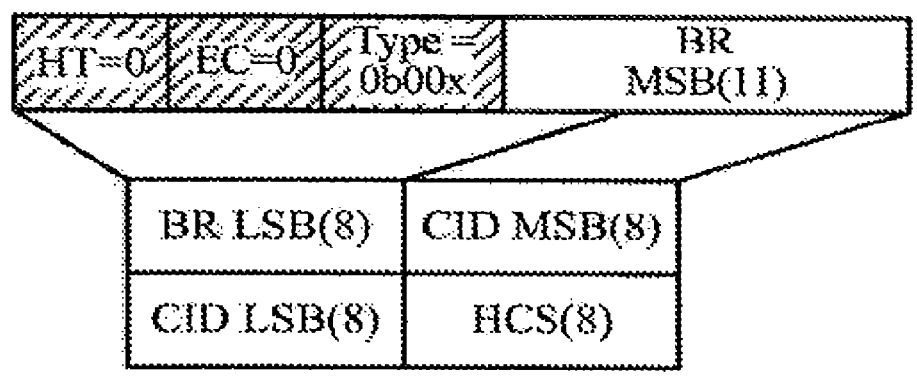
FIG. 38 illustrates an example BW-REQ message format.

FIGS. 37 and 38 illustrate RNG-REQ and BW-REQ message formats, from which hypotheses may be generated. Referring first to FIG. 37, the RNG-REQ message begins with a 6-byte general MAC header. The MAC header is followed by a 1-byte Management Message Type, followed by 1-byte Reserved field, followed by multiple Type-Length-Value (TLV) fields and, finally, a 32-bit CRC. Of these fields, some of this information is fixed and some of it is predictable.

As an example, the 1-byte Management Message Type is fixed at "4" for RNG-REQ messages and the 1-byte Reserved field is all zeroes. Further, the MAC header starts with 1-bit Header Type, followed by 1-bit Encryption Code (EC), a 6-bit Type field, and a 1-bit Extended Sub0-header field, all of which are zeroes for RNG-REQ messages. These fields are followed by a 1-bit CRC Indicator (CI), which is 1 for RNG-REQ, followed by a 2-bit Encryption Key Sequence (EKS) field, which is all zeros, followed by a 1-bit Reserved bit that is zero.

These fields are followed by a length field that may be at least partially determined by limiting the length of the TLVs. The maximum length of TLVs can be determined by accumulating all RNG-REQ related TLV lengths, as shown in FIG. 37, which yields 85 bytes according to one version of the IEEE 802.16e Standards. Thus, the RNG-REQ message cannot exceed 97 bytes including the MAC header and CRC32. As a result, only the bottom 8 bits of the length field are required to represent the length and the remaining MSBs will be zero.

All or part of a 16-bit Connection Identifier (CID) field in the MAC header may also be predicted in at least two ways. First, the Base Station has knowledge of what type of RNG-REQ will be sent through the allocated UL region, because it scheduled this itself. If that region is scheduled for Initial Ranging, the CID should be zero.

Second, if the Base Station does not know the type of RNG-REQ (e.g., the CID field may not be zero), the Base Station may use the maximum number of Mobile Stations that the Base Station can support. Since the Standards typically mandate that the CID in RNG-REQ shall be a Basic CID and the range of a Basic CID shall be between 1 and m (where m is the maximum value of the Basic CID), the maximum value of the CID field is known which may allow MSBs to be known. As an example, if the maximum CID value is 255, only the lower 8 bits are required and the remaining MSBs can be assumed to be zero.

The value of the Length field of each TLV is fixed by the Standards except the TLV type 21. Unfortunately, without knowing the Type, it may not be possible to use the Length value as hypothesis. However, if an assumption is made that the Type field of a given hypothesis is correct, the corresponding TLV bits may be used. Bit values of the TLV Length fields may be used in different hypotheses, for example, evaluated in second or further iterations, if the CRC32 of the message is not correct.

Referring to the BW-REQ message of FIG. 38, this message format has only 6 bytes. However, the first 4 bits of these have fixed values and these may be used as a-priori information. For certain embodiments, separate decoders may be provided to allow API decoding operations using RNG-REQ and BW-REQ hypotheses in parallel, similar to decoding operations using Normal and Compressed DL-MAP hypotheses described above. Alternatively, such hypotheses may be evaluated in a sequential manner.

Figure 39:
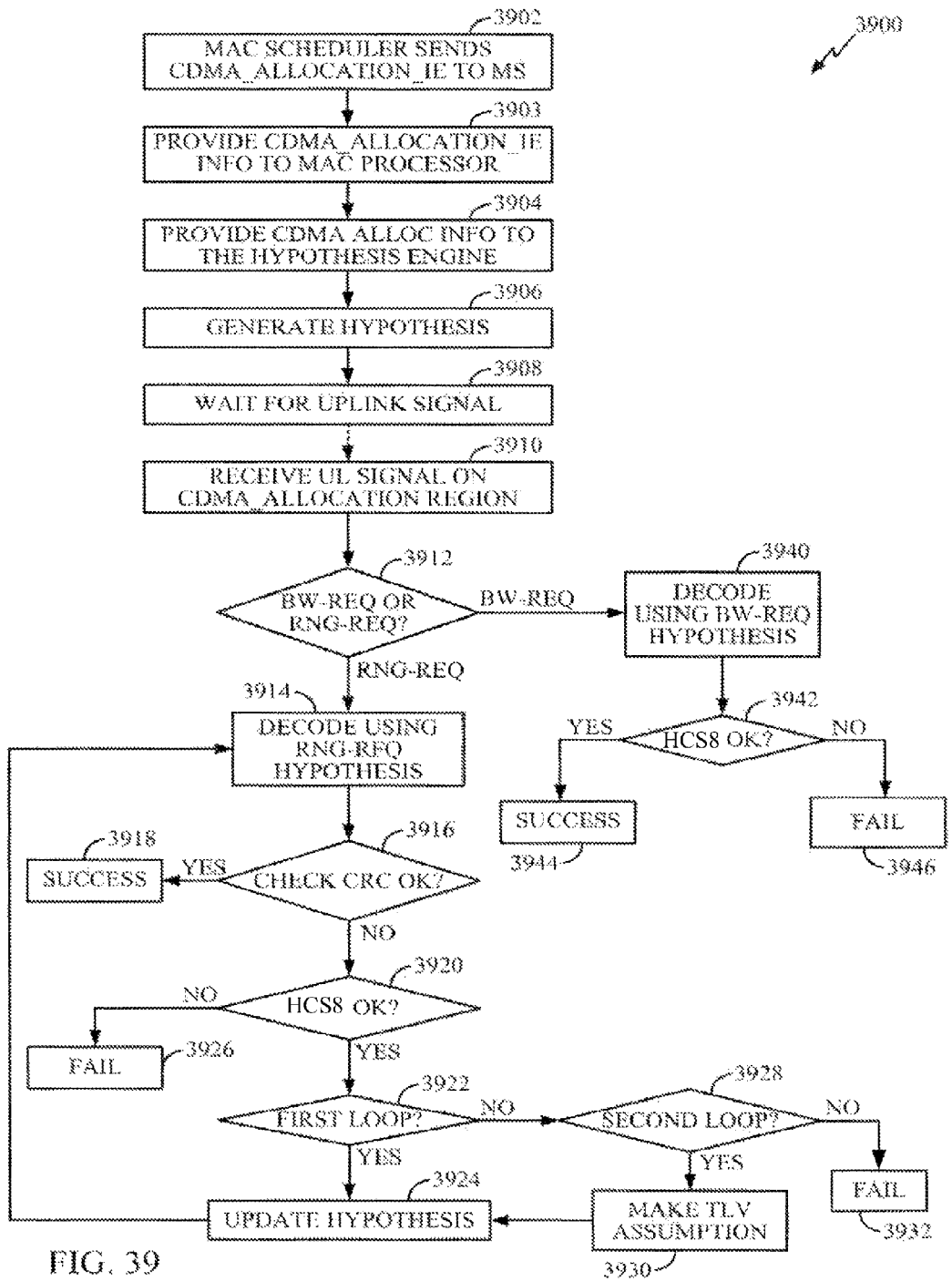
FIG. 39 illustrates example operations for API decoding of BW-REQ and RNG-REQ messages.

FIG. 39 is a flow diagram of example operations 3900 for API decoding of RNG-REQ and BW-REQ messages, for example, that may be performed by a Base Station receiver of FIG. 36.

The operations 3900 begin at 3902, by sending CDMA_ALLOCATION_IE, to allocate some amount of resources in an Uplink connection with a Mobile Station. At 3903, CDMA allocation information is provided to the processor 3660 and the processor 3660 provides the Hypothesis Engine with message type, timing and hypothesis information 3904 and, at 3906, BW_REQ and RNG_REQ hypotheses are generated. For certain embodiments, the hypotheses information may be stored at the Hypothesis Engine and updated only when changed (e.g., by the MAC Processor).

At 3908, the base station waits for an Uplink signal on the CDMA_ALLOCATION region. The Uplink signal on the CDMA_ALLOCATION region is received at 3910. At 3912, a determination is made as to whether the signal corresponds to a RNG_REQ message or a BW_REQ message.

If the signal corresponds to a RNG_REQ message, as determined at 3912, the signal is decoded using RNG_REQ hypothesis, at 3914. If the CRC of the decoded signal checks successfully, as determined at 3916, the decoding is a success, which may be indicated somehow at 3918.

Even if the CRC fails, it is possible that the header decoded properly, which determined by an HCS check, at 3920. If the HCS check fails, the header did not decode properly and decoding fails, at 3926.

However, if the HCS check is successful (indicating the MAC header decoded properly) and this is the first decoding loop, as determined at 3922, the hypothesis may be updated to reflect this, at 3924. Decoding operations may be performed again with the updated hypothesis (including MAC header in addition to other API bit values). For example, the MAC Processor may update hypothesis information provided to the Hypothesis Engine.

If the CRC fails again after API decoding with this additional hypothesis information, but the HCS check is again successful, the MAC Processor may try to decode with more aggressive assumption on the TLV items. For example, on the second decoding loop (after API decoding with the header bits), as determined at 3928, the MAC Processor may make TLV assumptions, at 3930. As an example, if the Type fields are assumed to be correct, most of Length fields can be used as a-priori information according to the Standard. For certain embodiments, there may be a limit to how many decoding iterations are allowed. For example, if the CRC fails again after this more aggressive decoding based on the TLV assumptions, the decoding fails, at 3932, even if the HCS matches.

Referring back to 3912, if the signal corresponds to a BW_REQ message, the signal is decoded using the BW_REQ hypothesis, at 3940. The BW_REQ message has only an HCS value and no CRC. Therefore, if the HCS of the decoded signal checks successfully, at 3942, the decoding is a success (3944). If the HCS check fails, the decoding fails, at 3946.

By performing API decoding at a base station, for example, using the hypotheses described herein, RNG-REQ and BW-REQ message decoding performance at the Base Station may be improved.

Figure 6A:
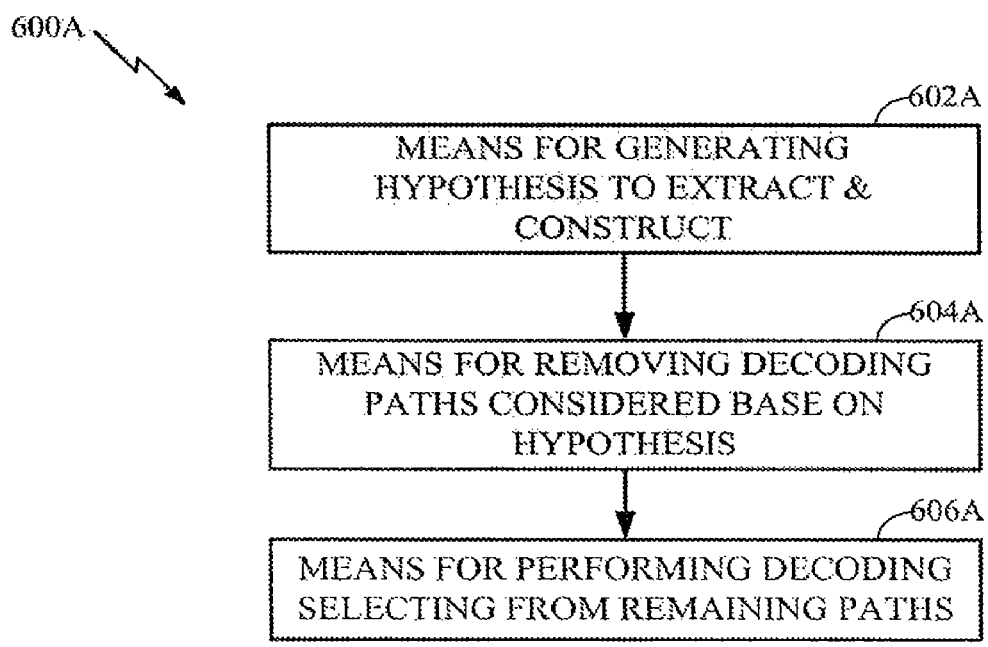

The various operations of methods described above may be performed by various hardware and/or software component(s) and/or module(s) corresponding to means-plus-function blocks illustrated in the Figures. For example, blocks 600-606 illustrated in FIG. 6 correspond to means-plus-function blocks 600A-606A illustrated in FIG. 6A. More generally, where there are methods illustrated in Figures having corresponding counterpart means-plus-function Figures, the operation blocks correspond to means-plus-function blocks with similar numbering.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated in the Figures, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims As used herein, the term "determining" encompasses a wide variety of actions. For example, "determining" may include calculating, computing, processing, deriving, investigating, looking up (e.g., looking up in a table, a database or another data structure), ascertaining and the like, and vice versa. Also, "determining" may include receiving (e.g., receiving information), accessing (e.g., accessing data in a memory) and the like. Also, "determining" may include resolving, selecting, choosing, establishing and the like, and vice versa.

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to embodiments of the present invention, other and further embodiments of the invention may be devised without departing from the basic scope thereof, and the scope thereof is determined by the claims that follow.

The invention claimed is:

1. A method for decoding encoded data bits of a wireless communication transmission for a mobile application part (MAP) message, comprising:
   generating a hypothesis specifying a set of bit values of the encoded data bits based on a-priori information regarding at least one of: the content of the MAP message and a parameter of a related transmission;
   decoding the transmission by eliminating from consideration sets of decoded bits that are inconsistent with the specified bit values and selecting, as output, decoded bits that are consistent with the bit values specified by the hypothesis;
   determining the MAP message is not decoded successfully;
   determining a media access control (MAC) header of the MAP message is decoded successfully;
   updating the hypothesis to specify updated bit values of the successfully decoded MAC header; and
   again decoding the transmission by eliminating from consideration sets of decoded bits that are inconsistent with the updated specified bit values and selecting, as output, decoded bits that are consistent with the updated bit values specified by the updated hypothesis.

2. The method of claim 1, wherein the MAP message comprises at least one of a normal downlink mobile application part (Normal DL-MAP) message, a compressed downlink mobile application part (Compressed DL-MAP) message, an uplink mobile application part (UL-MAP) message, a range request (RNG-REQ) message, and a bandwidth request (BW-REQ) message.

3. The method of claim 1, wherein generating the hypothesis comprises:
   specifying one or more bit values based on a value that is fixed all the time according to a Standard, wherein the Standard comprises a member of one of the IEEE 802.16 Worldwide Interoperability for Microwave Access (WiMAX) or IEEE 802.20 Mobile Broadband Wireless Access (MBWA) family of standards.

4. The method of claim 1, wherein generating the hypothesis comprises:
   specifying one or more bit values based on a value of a field in a previously decoded MAP message and the number of bits expected to change in a presently decoded transmission.

5. The method of claim 4, wherein the value of the field is expected to monotonically increase.

6. The method of claim 4, wherein the value of the field is expected not to be changed during the operation.

7. The method of claim 1, wherein:
   the MAP message is an uplink mobile application part (UL-MAP) message; and
   generating the hypothesis comprises specifying one or more bit values based on a value of a field in the MAP message determined, at least in part, by an RF bandwidth and frame duration.

8. The method of claim 1, wherein:
   the MAP message is a range request (RNG-REQ) message; and
   generating the hypothesis comprises specifying one or more bit values based on a value that is fixed according to a Standard with an assumption that some of the received fields are correct, wherein the Standard comprises a member of one of the IEEE 802.16 Worldwide Interoperability for Microwave Access (WiMAX) or IEEE 802.20 Mobile Broadband Wireless Access (MBWA) family of standards.

9. A receiver for wireless communication, comprising:
a receiver front end for receiving a wireless transmission for a mobile application part (MAP) message and generating a set of encoded bits;
a Hypothesis Engine for generating one or more hypotheses, each specifying a set of bit values of the encoded data bits based on a-priori information regarding the MAP message;
a decoder configured to:
decode the encoded bits by eliminating from consideration sets of decoded bits that are inconsistent with the bit values specified by the hypotheses and selecting, as output, decoded bits consistent with bit values specified by one of the hypotheses; and
one or more processors configured to:
determine the MAP message was not decoded successfully but that a media access control (MAC) header of the message was decoded successfully;
signal the Hypothesis Engine to update the hypotheses to specify updated bit values corresponding to the successfully decoded media access control MAC header; and
signal the decoder to decode the encoded bits by eliminating from consideration sets of decoded bits that are inconsistent with the updated specified bit values specified by the updated hypotheses and selecting, as output, decoded bits consistent with the updated bit values specified by the updated hypotheses.

10. The receiver of claim 9, wherein the MAP message comprises at least one of:
a range request (RNG-REQ) message and a bandwidth request (BW-REQ) message.

11. The receiver of claim 10, wherein the Hypothesis Engine is configured to generate at least one hypothesis specifying bit values corresponding to a RNG-REQ message and at least one hypothesis specifying bit values corresponding to a BW-REQ message.

12. The receiver of claim 9, wherein the MAP message comprises at least one of:
an uplink mobile application part Uplink MAP (UL-MAP) message, a normal downlink mobile application part Normal Downlink MAP (Normal DL-MAP) message, and
a compressed downlink mobile application part (Compressed DL-MAP) message.

13. The receiver of claim 12, wherein the Hypothesis Engine is configured to generate at least one hypothesis specifying bit values corresponding to a Normal DL-MAP message and at least one hypothesis specifying bit values corresponding to a Compressed DL-MAP message.

14. The receiver of claim 13, wherein the decoder comprises at least two decoding circuits for decoding, in parallel, the encoded bits based on the hypothesis specifying bit values corresponding to a Normal DL-MAP message and the hypothesis specifying bit values corresponding to a Compressed DL-MAP message.

15. The method of claim 9, wherein generating the Hypothesis Engine is configured to generate at least one hypothesis by:
specifying one or more bit values based on a value that is fixed all the time according to a Standard, wherein the Standard comprises a member of one of the IEEE 802.16 Worldwide Interoperability for Microwave Access (WiMAX) or IEEE 802.20 Mobile Broadband Wireless Access (MBWA) family of standards.

16. The receiver of claim 9, wherein the Hypothesis Engine is configured to generate at least one hypothesis by:
specifying one or more bit values based on a value of a field in a previously decoded MAP message and the number of bits expected to change in a presently decoded transmission.

17. The receiver of claim 16, wherein the value of the field is expected to monotonically increase.

18. The method of claim 16, wherein the value of the field is expected not to be changed during the operation.

19. The receiver of claim 9, wherein:
the MAP message is an uplink mobile application part (UL-MAP) message; and
the Hypothesis Engine is configured to generate at least one hypothesis by specifying one or more bit values based on a value of a field in the MAP message determined, at least in part, by an RF bandwidth and frame duration.

20. An apparatus for wireless communications, comprising:
means for receiving a wireless transmission for a mobile application part (MAP) message and generating a set of encoded bits;
means for generating one or more hypotheses, each specifying a set of bit values of the encoded data bits based on a-priori information regarding the MAP message;
means for decoding the encoded bits by eliminating from consideration sets of decoded bits that are inconsistent with the bit values specified by the hypotheses and selecting, as output, decoded bits consistent with bit values specified by one of the hypotheses;
means for determining the MAP message was not decoded successfully but that a media access control (MAC) header of the message did decode successfully;
means for signaling the means for generating hypotheses to update the hypotheses to specify updated bit values corresponding to the successfully decoded MAC header; and
means for signaling the means for decoding to decode the encoded bits by eliminating from consideration sets of decoded bits that are inconsistent with the updated bit values specified by the updated hypotheses and selecting, as output, decoded bits consistent with the updated bit values specified by the updated hypotheses.

21. The apparatus of claim 20, wherein:
the MAP message comprises at least one of: a range request (RNG-REQ) message and a bandwidth request (BW-REQ) message; and
the means for generating one or more hypotheses is configured to generate at least one hypothesis specifying bit values corresponding to a RNG-REQ message and at least one hypothesis specifying bit values corresponding to a BW-REQ message.

22. The apparatus of claim 20, wherein the MAP message comprises at least one of: an uplink mobile application part Uplink MAP (UL-MAP) message, a normal mobile application part Normal Downlink MAP (Normal DL-MAP) message, and a compressed mobile application part (Compressed DL-MAP) message.

23. The apparatus of claim 22, wherein the means for generating hypotheses is configured to generate at least one hypothesis specifying bit values corresponding to a Normal DL-MAP message and at least one hypothesis specifying bit values corresponding to a Compressed DL-MAP message.

24. A mobile device, comprising:
a receiver front end for receiving a wireless transmission for a mobile application part (MAP) message and generating a set of encoded bits;
a Hypothesis Engine for generating one or more hypotheses, each specifying a set of bit values of the encoded data bits based on a-priori information regarding at least one of: content of the MAP message or a previously decoded MAP message;
a decoder configured to:
decode the encoded bits by eliminating from consideration sets of decoded bits that are inconsistent with the bit values specified by the hypotheses and selecting, as output, decoded bits consistent with bit values specified by one of the hypotheses; and
one or more processors configured to:
determine the MAP message did not decode successfully but that a media access control (MAC) header of the MAP message did decode successfully;
signal the Hypothesis Engine to update the hypotheses to specify updated bit values corresponding to the successfully decoded MAC header; and
signal the decoder to decode the encoded bits by eliminating from consideration sets of decoded bits that are inconsistent with the updated bit values specified by the updated hypotheses and selecting, as output, decoded bits consistent with the updated bit values specified by the updated hypotheses.

25. The mobile device of claim 24, wherein the MAP message comprises at least one of a normal downlink mobile application part Normal Downlink MAP (Normal DL-MAP) message, and a compressed downlink mobile application part (Compressed DL-MAP) message.

26. The mobile device of claim 24, wherein:
the Hypothesis Engine is configured to generate at least one hypothesis specifying bit values corresponding to a normal downlink mobile application part (Normal DL-MAP) message and at least one hypothesis specifying bit values corresponding to a compressed downlink mobile application part (Compressed DL-MAP) message; and
the decoder comprises at least two decoding circuits for decoding, in parallel, the encoded bits based on the hypothesis specifying bit values corresponding to a Normal DL-MAP message and the hypothesis specifying bit values corresponding to a Compressed DL-MAP message.

27. A computer-program product for wireless communications comprising a non-transitory computer readable medium having a set of instructions stored thereon, the set of instructions being executable by one or more processors and the set of instructions comprising:
instructions for receiving a wireless transmission for a mobile application part (MAP) message and generating a set of encoded bits;
instructions for generating one or more hypotheses, each specifying a set of bit values of the encoded data bits based on a-priori information regarding the MAP message;
instructions for decoding the encoded bits by eliminating from consideration sets of decoded bits that are inconsistent with the bit values specified by the hypotheses and selecting, as output, decoded bits consistent with bit values specified by one of the hypotheses;
instructions for determining the MAP message was not decoded successfully but that a MAC header of the message did decode successfully;
instructions for signaling the instructions for generating hypotheses to update the hypotheses to specify updated bit values corresponding to the successfully decoded media access control (MAC) header; and
instructions for signaling the instructions for decoding to decode the encoded bits by eliminating from consideration sets of decoded bits that are inconsistent with the updated bit values specified by the updated hypotheses and selecting, as output, decoded bits consistent with the updated bit values specified by the updated hypotheses.

28. The computer-program product of claim 27, wherein:
the MAP message comprises at least one of: a range request (RNG-REQ) message and a bandwidth request (BW-REQ) message; and
the instructions for generating one or more hypotheses is configured to generate at least one hypothesis specifying bit values corresponding to a RNG-REQ message and at least one hypothesis specifying bit values corresponding to a BW-REQ message.

29. The computer-program product of claim 27, wherein the MAP message comprises at least one of: an uplink mobile application part Uplink MAP (UL-MAP) message, a normal downlink mobile application part Normal Downlink MAP (Normal DL-MAP) message, and a compressed downlink mobile application part (Compressed DL-MAP) message.

30. The computer-program product of claim 29, wherein the instructions for generating hypotheses are configured to generate at least one hypothesis specifying bit values corresponding to a Normal DL-MAP message and at least one hypothesis specifying bit values corresponding to a Compressed DL-MAP message.

* * * * *